United States Patent [19]

Quintus et al.

[11] Patent Number: 4,833,418
[45] Date of Patent: May 23, 1989

[54] COMPENSATION CIRCUIT FOR NULLIFYING DIFFERENTIAL OFFSET VOLTAGE AND REGULATING COMMON MODE VOLTAGE OF DIFFERENTIAL SIGNALS

[75] Inventors: John J. Quintus, Buena Park; Michael S. Sheehan, Santa Ana, both of Calif.

[73] Assignee: Archive Corporation, Costa Mesa, Calif.

[21] Appl. No.: 239,302

[22] Filed: Sep. 1, 1988

[51] Int. Cl.$^4$ .............................................. H03F 3/45
[52] U.S. Cl. ..................................... 330/9; 330/258; 330/259
[58] Field of Search .................... 330/9, 252, 254, 258, 330/259, 148

[56] References Cited

U.S. PATENT DOCUMENTS 3,845,404 10/1974 Trilling ........................... 330/258 X
4,363,977 12/1982 Tsuda et al. .............................. 330/9
4,490,682 12/1984 Poulo ...................................... 330/9

FOREIGN PATENT DOCUMENTS 0111415 7/1983 Japan ................................... 330/259

Primary Examiner—Steven Mottola
Attorney, Agent, or Firm—Knobbe, Martens, Olson & Bear

[57] ABSTRACT

An apparatus for nullifying the differential output offset voltage between the outputs of a differential amplifier and for setting the DC levels of the outputs to a known reference voltage includes a circuit which cross-couples the opposing AC output signals to obtain only the DC components of each signal. The apparatus further includes a first operational amplifier to generate a compensation voltage from the DC components of the outputs of the differential amplifier proportional to the amount of offset between the DC components of the outputs of the differential amplifier. The compensation voltage is fed back to the offset control inputs of the differential amplifier to reduce the differential offset voltage to substantially zero volts. The apparatus further includes a dual voltage divider network having a second operational amplifier that supplies a variable reference voltage to one terminal of each leg of the voltage divider network. The outputs of the differential amplifier each provided to a respective other terminal of the dual voltage divider network. The second operational amplifier has a reference voltage on one of its inputs. A signal responsive to the common mode output voltage from the differential amplifier is provided to the other input. The second operational amplifier provides an output voltage that is responsive to the common mode voltage output from the differential amplifier. The output voltage from the second operational amplifier provided to the terminals of the dual voltage divider network varies such that the voltage outputs from the voltage divider network have a common mode voltage substantially equal to the reference voltage.

13 Claims, 10 Drawing Sheets

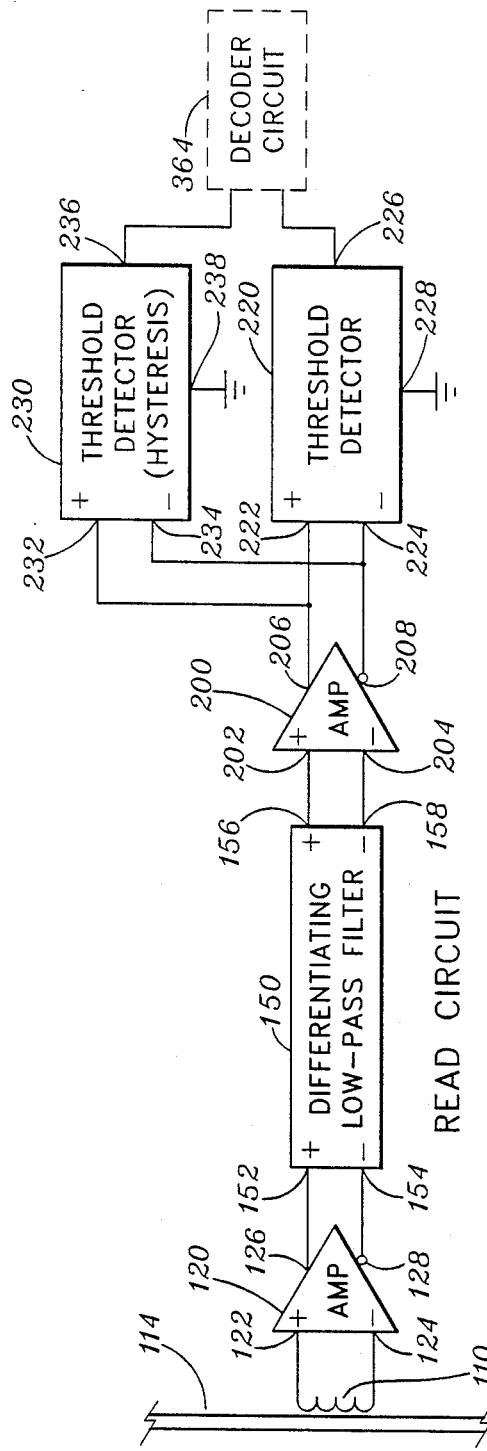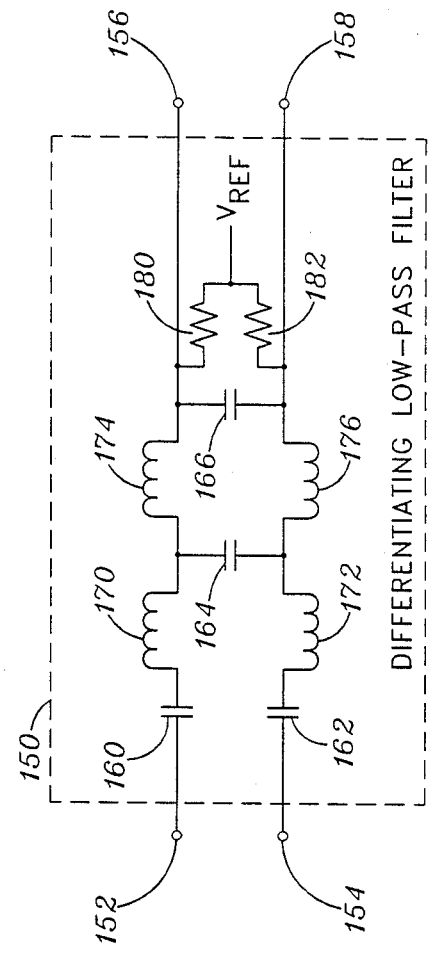
FIG. 1
FIG. 3

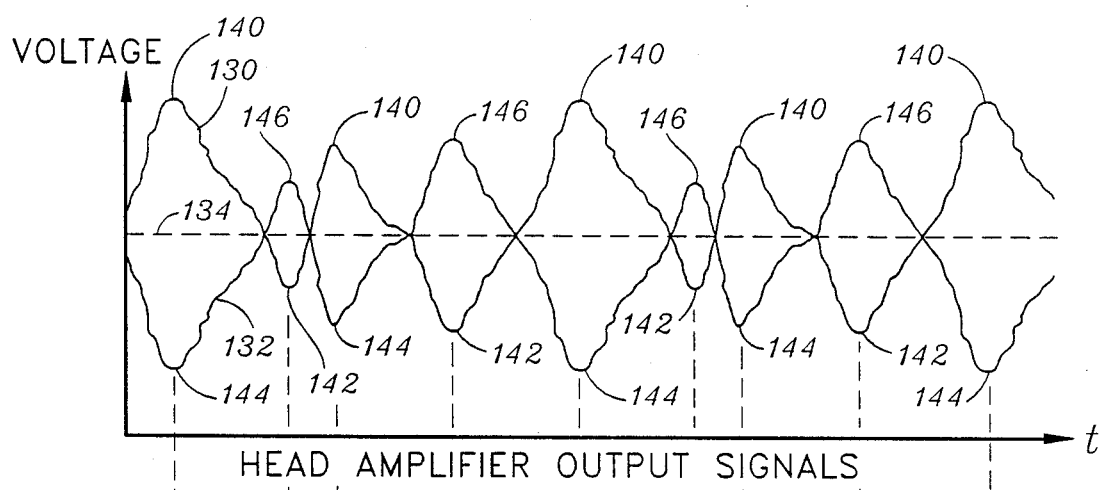
FIG. 2 HEAD AMPLIFIER OUTPUT SIGNALS
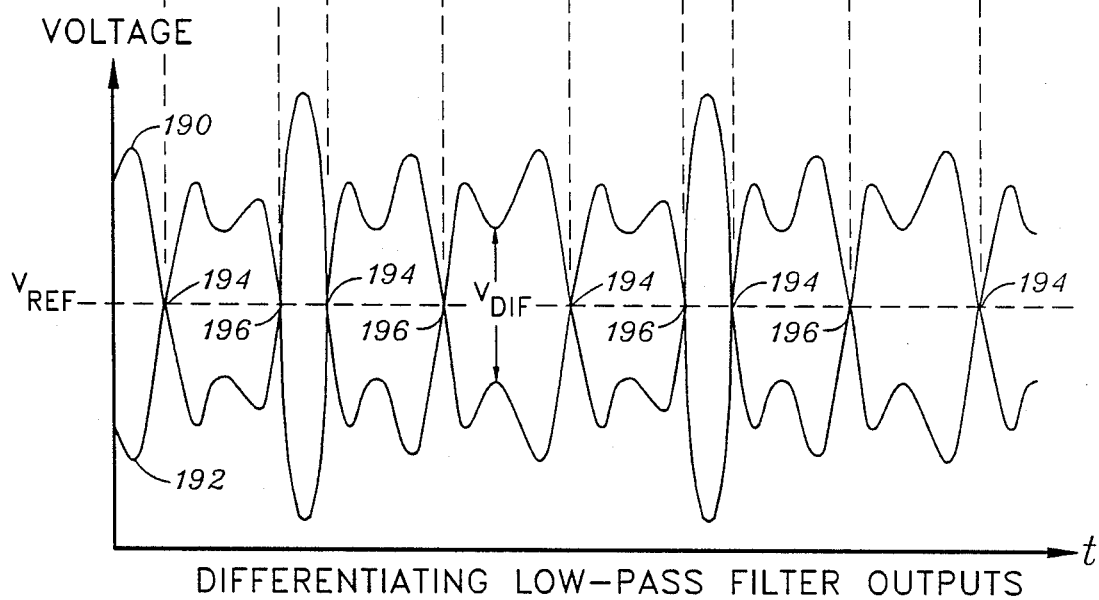
FIG. 4 DIFFERENTIATING LOW-PASS FILTER OUTPUTS

SECOND THRESHOLD DETECTOR INPUT VOLTAGES

COMPARATOR INPUT VOLTAGES

COMPARATOR OUTPUT VOLTAGE

SECOND THRESHOLD DETECTOR INPUT VOLTAGES

COMPARATOR INPUT VOLTAGES

COMPARATOR OUTPUT VOLTAGE

SECOND THRESHOLD DETECTOR INPUT SIGNALS

COMPARATOR INPUT SIGNALS

COMPARATOR OUTPUT VOLTAGE 4,833,418

COMPENSATION CIRCUIT FOR NULLIFYING DIFFERENTIAL OFFSET VOLTAGE AND REGULATING COMMON MODE VOLTAGE OF DIFFERENTIAL SIGNALS

BACKGROUND OF THE INVENTION

1. Field of the Invention

The present invention relates to electrical circuits used in digital magnetic recording devices, such as digital magnetic tape drives, magnetic disk drives, and the like, and, more particularly, relates to circuits used to convert electrical signals from a magnetic read head to digital data.

2. Description of the Related Art

Digital tape drives are commonly used to store large amounts of computer generated digital data onto a magnetic recording tape. For example, such tape drives are used to backup large amounts of computer data stored on hard disk drives to provide compact long-term storage of the data.

Digital data (1's and 0's) are stored on tape and other magnetic media (such as disk drives) by transitions in a magnetic field generated by a write head proximate to the surface of the magnetic media. The transitions in the magnetic field cause the magnetic poles of particles on the surface of the recording media to become aligned in accordance with the direction of the magnetic field generated by the write head. Digital 1's and 0's are thus represented on the magnetic media by the alignments of the magnetic poles of the particles. A number of different encoding schemes are used to translate the digital 1's and 0's into magnetic field transitions and thus to particle alignments on the magnetic media. Some examples of such encoding schemes are return to zero (RZ) encoding, non-return to zero (NRZ), non-return to zero inverted (NRZI), phase encoding (PE), and the like.

When the data is to be recovered from the magnetic recording media, the media is moved past a read head that is also positioned proximate to the media surface. The read head senses transitions in a magnetic field caused by the alignments of the magnetic particles on the media surface as it passes by the read head. The read head generates a small electrical voltage that is responsive to the magnetic field transitions. The generated head voltage is amplified and is provided to an associated read circuit which converts the head voltage to digital data that corresponds to the original digital data that was encoded onto the magnetic media. The read circuit accomplishes this by sensing the peaks in the head voltage that correspond to the magnetic field transitions. The peaks are sensed by differentiating the amplified head voltage to provide a differential pair of differentiated voltages that have equal magnitudes at times that correspond to the peaks of the amplified head voltage. The times at which the equal magnitudes occur are detected by threshold detection circuitry within the read circuit, and the timing of the occurrences of equal magnitude are used to determine whether the data to be reproduced is a digital 1 or a digital 0. The times when the voltages of the pair of differential voltage have equal magnitudes are commonly referred to as the "zero-crossings" of the pair of voltages, although one skilled in the art will understand that at the "zero-crossings", the pair of voltages have a non-zero magnitude.

In order to successfully reproduce the digital data in accordance with the above-described technique, it is important that the read circuit accurately locate the zero-crossings of the differentiated voltage. Typical tape read circuits use differential amplifier circuits to amplify the signals from the read head to a usable signal level. Other amplifier circuits are used to amplify the differentiated signal prior to the threshold detection circuitry. Because of imperfections in the amplifier circuits, each stage of amplification has the potential of introducing errors in the amplified signals that can cause the threshold detection circuitry to provide an output signal having errors in the time locations of the zero-crossings of the differentiated signal. These errors can be caused, for example, by amplifiers having differential voltage offsets in their differential output voltages when the offset should be zero and/or having a common mode voltage offset on the differential outputs. For high data densities on the magnetic media, small errors in the timing of the zero-crossing signals can prevent the accurate reproduction of the digital data.

Known magnetic recording and playback devices include compensation circuitry to adjust the amplifier stages to reduce the differential and common mode voltage offsets. However, known compensation circuitry generally includes a manual adjustment devices, such as a potentiometer, or the like, that are adjusted in the factory to provide desirable offset voltages. However, such adjustments seldom are adequate over a wide temperature range and are further subject to variation with time. Furthermore, manual adjustment of the compensation circuitry is undesirable in a mass produced unit such a magnetic tape drive. Thus, a need exists for an automatic system for adjusting the differential and common mode voltage offsets that does not need an initial manual adjustment and that is self-compensating as components vary with temperature and time.

SUMMARY OF THE INVENTION

The present invention comprises a compensation circuit for use in a tape head read circuit. The compensation circuit nullifies the output offset voltage between the noninverting and inverting output signals from a differential amplifier. The circuit also regulates the common mode voltage of the outputs of a differential amplifier, setting it to a known reference value.

The compensation circuit first isolates the DC components of the noninverting and inverting output signals from the differential amplifier at each of two summing junctions. Each component is isolated by cross-coupling the AC component of each output signal with the AC and DC components of the other output signal. The AC components of the differential amplifier output signals are substantially equal and opposite to each other, and the AC components cancel each other at the summing junctions such that the voltage at each summing junction comprises only the DC component of one of the two output signals.

The DC components of the outputs from the differential amplifier are provided as input signals to an operational amplifier. The operational amplifier provides an output signal that is proportional to the differential offset voltage between the DC components of the noninverting and inverting output signals from the differential amplifier. The output signal from the operational amplifier is provided as an input signal to a gain control adjustment input of the differential amplifier to provide feedback from the operational amplifier to the differential amplifier. This feedback arrangement results in continuous adjustment of the DC differential offset of the outputs of the differential amplifier to maintain the differential output voltage to a magnitude that is substantially equal to zero.

The compensation circuit further sets the common mode DC voltage of the noninverting and inverting output signals from the differential amplifier to a known reference voltage. The isolated DC components at the summing junctions are provided as an input to a first input terminal of a second operational amplifier. The known reference voltage is provided as an input to second input terminal of the operational amplifier. The second operational amplifier provides an output signal that is responsive to the difference between the voltage on first input and the reference voltage on the second input. The output signal from the second operational amplifier is provided as an input signal to respective first inputs of a pair of voltage divider networks. The voltage divider networks have respective second inputs that are connected to receive the output signals from the differential amplifier. The voltage divider networks have outputs that provide output signals that are responsive to the signals on the first and second inputs of the voltage divider networks. The second operational amplifier automatically adjust its output voltage in response to the common mode voltage level of the output signals from the differential amplifier so that DC components of the output signals from the voltage divider networks are substantially constant and substantially equal to the reference voltage. In the preferred embodiment, as the common mode voltage of the output signals from the differential amplifier increases, the termination voltage of the voltage divider network decreases and vice-versa.

BRIEF DESCRIPTION OF THE DRAWINGS

FIG. 1 illustrates a block diagram of an exemplary tape drive read circuit.

FIG. 2 illustrates a waveform that represents an exemplary signal from a tape read head amplifier.

FIG. 3 illustrates a circuit diagram of an exemplary differential differentiating low-pass filter circuit such as may be used in the tape drive read circuit of FIG. 1.

FIG. 4 illustrates a waveform that represents the signal of FIG. 2 after passing through the differential differentiating low-pass filter of FIG. 3.

DETAILED DESCRIPTION OF THE PREFERRED EMBODIMENT

Figure 5:
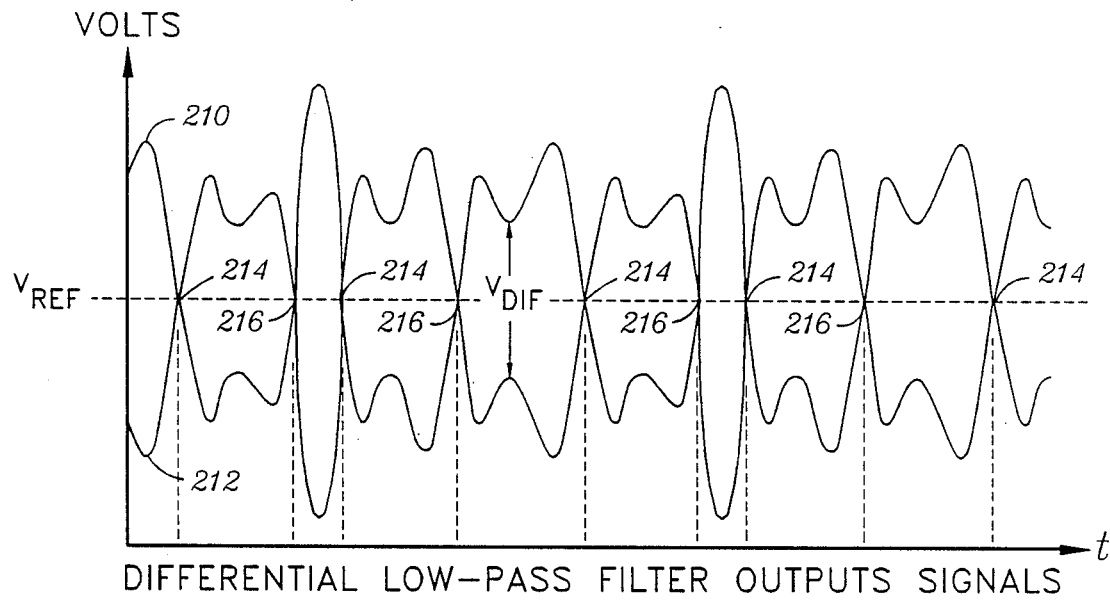
FIG. 5 illustrates a waveform that represents the signal of FIG. 4 after being amplified by the differential amplifier of FIG. 1.

Before describing the preferred embodiment of the present invention, a review of the operation of an exemplary read circuit in a magnetic tape drive will be presented so that the problem that is solved by the present invention will be better understood.

Description of an Exemplary Read Circuit and the Problem to Be Solved by the Present Invention FIG. 1 illustrates an overall block diagram of an exemplary tape drive read circuit 100. As illustrated, the read circuit 100 includes a read head 110. As is well known in the art, as a segment of recorded magnetic tape 114 travels past the read head 110, changes in the magnetic field caused by the magnetic orientations of the particles on the tape 114 induce small electrical voltages in the read head 110. These small read voltages are provided as a time-varying differential output signal from the read head 110. Since the voltages are very small, the output signal from the read head 110 is provided as a differential input signal to a read head amplifier 120 via a noninverting (+) input terminal 122 and an inverting (−) input terminal 124. Preferably, the read head amplifier 120 is a differential video amplifier such as the TL040, commercially available from Texas Instruments, Inc.

As is well-known in the art, the read head amplifier 120 provides a differential output signal between a noninverting output terminal 126 and an inverting output terminal 128 that is proportional to the voltage difference across its input terminals 122 and 124. A waveform 130 in FIG. 2 represents an exemplary output signal provided on the noninverting output terminal 126 of the read head amplifier 120. In similar manner, a waveform 132 in FIG. 2 represents an exemplary output signal provided on the inverting output terminal 128 of the read head amplifier 120. It can be seen that the waveform 130 and the waveform 132 represent differential output signals such that when the waveform 130 is increasing in magnitude, the waveform 132 is decreasing in magnitude, and vice versa. The waveforms 130 and 132 are represented as idealized waveforms wherein both waveforms cross a common mode voltage level, represented by a dashed line 134, at the same time.

In typical read circuits, such as the read circuit 100 of FIG. 1, the amplified output signals from the read head amplifier 120 are not used directly by the circuitry that derives the digital data from the voltage output of the read head 110. Rather, as is well-known in the art, the digital information is encoded by the peaks in the magnitude of the read head voltage that correspond to the maximum rate of change of the magnetic fields of the particles on the tape 114. These peaks are indicated at the locations 140 and 142 on the waveform 130 and at the locations 144 and 146 on the waveform 132. Generally, it is easier to detect the time at which a signal crosses a particular voltage threshold than it is to detect a relative maximum in a signal. Furthermore, the amplified signals from the read head amplifier 120 typically include undesirable high frequency noise. Thus, the read circuit 100 further includes a differential differentiating low-pass filter 150 having a noninverting input terminal 152, an inverting input terminal 154, a noninverting output terminal 1156 and an inverting output terminal 158. The noninverting input terminal 152 is connected to the noninverting output terminal 126 of the read head amplifier 120 to thereby receive the noninverted signal, and the inverting input terminal 154 is connected to the inverting output terminal 128 of the read head amplifier 120 to thereby receive the inverted output signal.

In one exemplary form, the differentiating low-pass filter 150 includes a plurality of capacitors 160, 162, 164, 166 and 168, and a plurality of inductors 170, 172, 174 and 176, connected between the input terminals 152, 154 and the output terminals 156, 158, as illustrated in FIG. 3, to provide the differentiating and filtering functions. In addition, a pair of resistors 180 and 182 are connected from the noninverting output terminal 156 and the inverting output terminal 158, respectively, to a DC reference voltage $V_{REF}$ so that the output signals of the differential low-pass filter 180 are referenced to the voltage reference $V_{REF}$.

The output signals from the differential differentiating low-pass filter 150 are illustrated in FIG. 4 as a waveform 190 that represents the signal on the noninverting output terminal 156 and a waveform 192 that represents the signal on the inverting output terminal 158. The waveform 190 represents the result of differentiating and filtering the waveform 130 of FIG. 2, and the waveform 192 represents the result of differentiating and filtering the waveform 132 of FIG. 2. It can be seen that the waveforms 190 and 192 have zero differential offset voltages $V_{DIF}$ between them at a plurality of locations 194 which correspond in times to the peaks 140 and 144 on the waveforms 130 and 132, and that the waveforms 190 and 192 have zero differential offset voltages at a plurality of locations 196 which correspond in times to the peaks 142 and 146 on the waveforms 130 and 132. Again the waveform 190 and the waveform 192 represent differential signals with the waveform 190 increasing in magnitude when the waveform 192 decreases in magnitude, and vice versa. Ideally, both waveforms will have a magnitude substantially equal to the reference voltage $V_{REF}$ at the same time.

In the embodiments described herein, the signals are differential signals, and the term "zero-crossing" is intended to refer to the time at which the magnitude of the noninverted signal in a pair of differential signals is equal to the magnitude of the inverted signal in that same pair. In other words, at zero-crossing, the differential voltage between the two signals is equal to zero. Preferably, at zero-crossing, the magnitudes of both signals will be substantially equal to a voltage corresponding to the reference voltage. Thus, it can be seen that the zero-crossings of the waveform 190 and the waveform 192, at the plurality of locations 194 and 196 are referenced to the reference voltage $V_{REF}$ and are also considered to be voltage reference crossings. Thus, as used herein, the term "zero-crossing" will also refer to the time at which the magnitude of a signal voltage crosses the level of a known reference voltage. In one exemplary embodiment of the differentiating differential low-pass filter 150, the reference voltage $V_{REF}$ is selected to be approximately one-half the positive supply voltage for the amplifier circuits (e.g., approximately 2.5 volts when a 5-volt supply is used).

The noninverted output signal and the inverted output signal from the output terminals 156 and 158, respectively, of the differential low-pass filter 150 are provided as inputs to a differential amplifier 200 via a noninverting (+) input terminal 202 and an inverting (−) input terminal 204. In an exemplary embodiment of the read circuit 100, the differential amplifier 200 is advantageously a video amplifier, such as the video amplifier portion of the 2441 video amplifier, manufactured by National Semiconductor Corporation. The differential amplifier 200 amplifies the differential input signals on the input terminals 202 and 204 and produces a noninverted output signal on a noninverting (+) output terminal 206 and an inverted output signal on an inverting (−) output terminal 208. The noninverted output signal and the inverted output signal together comprise a differential output signal and are represented by a waveform 210 and a waveform 212 of FIG. 5. It should, of course, be understood that the magnitudes of the output signals from the differential amplifier 200 are greater than the corresponding input signals from the differentiating low-pass filter 150. Furthermore, the two output signals are referenced to a common mode DC voltage $V_{CM}$ that has a magnitude that is characteristic of the differential amplifier 200 and that may vary with temperature, aging, and other factors. The two output signals have the same voltage magnitudes at a plurality of "zero-crossings" 214 and 216 that generally correspond to the zero-crossings 194 and 196 of the waveforms 190 and 192 of FIG. 4.

The differential output signals from the differential amplifier 200 are connected to the inputs of a first threshold detector circuit 220 that has a noninverting input terminal 222, an inverting input terminal 224, an output terminal 226 and a reference voltage terminal 228. The differential output signals from the differential amplifier 200 are also connected to the inputs of a second threshold detector circuit 230 that has a noninverting input terminal 232, an inverting input terminal 234, an output terminal 236 and a reference voltage terminal 238. In particular, the noninverted output signal from the differential amplifier 200 is provided as an input to the noninverting input terminals 222 and 232 of the threshold detectors 220 and 230, and the inverted output signal from the differential amplifier 200 is provided as an input to the inverting input terminals 224 and 234 of the two threshold detectors. In FIG. the reference voltage terminals 228 and 238 of the two threshold detectors 220 and 230 are connected to the ground reference.

Figure 6:
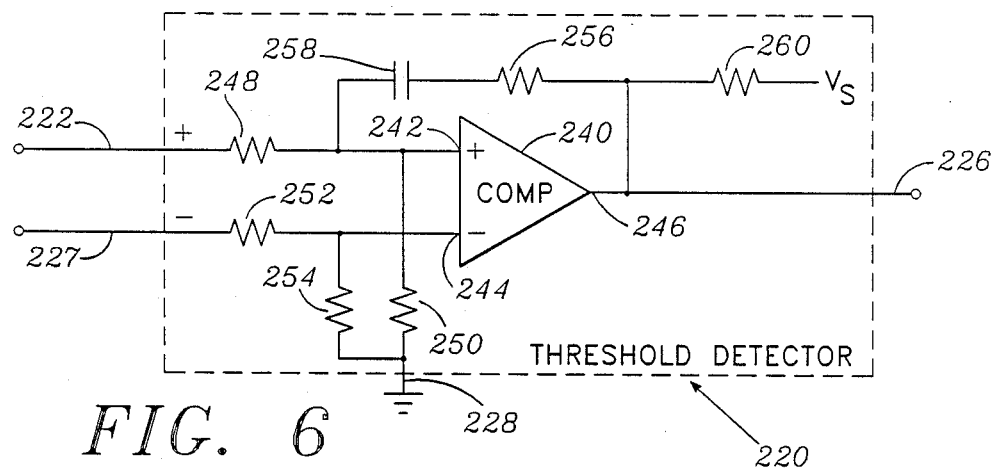
FIG. 6 illustrates a circuit diagram of an exemplary simplified threshold detector circuit without hysteresis.

An exemplary embodiment of the first threshold detector circuit 220 is illustrated in FIG. 6. As illustrated, the first threshold detector circuit comprises a comparator 240 having a noninverting input terminal 242, an inverting input terminal 244 and an output terminal 246. The noninverting input terminal 242 is connected via a resistor 248 to the noninverting input terminal 222 of the first threshold detector circuit 220 and is connected via a resistor 250 to the reference voltage input terminal 228 of the first threshold detector circuit 220. The inverting input terminal 244 of the comparator 240 is connected via a resistor 22 to the inverting input terminal 224 of the first threshold detector circuit 220 and via a resistor 254 to the reference voltage input terminal 228 of the first threshold detector circuit 220. The resistor 248 and the resistor 250 act as a voltage divider between the noninverting input terminal 222 of the first threshold detector circuit 220 and the noninverting input terminal 242 of the comparator 240 so that the voltage applied to the noninverting input terminal 222 is reduced in magnitude. The voltage reduction is advantageously used to reduce the magnitude of the voltages applied to the input terminals of the comparator 240 to the approximate center of the operating range for the comparator 240. For example, when the voltage reference input terminal is connected to the ground reference as illustrated in FIG. 6, the resistor 250 has a resistance approximately equal to the resistance of the resistor 248 so that the magnitude of the voltage applied to the noninverting input terminal 242 of the comparator 240 is approximately one-half the magnitude of the voltage applied to the noninverting input terminal 222 of the first threshold detector circuit 220. Thus, an output voltage from the differential amplifier 200 that has a DC voltage component of 5 volts will be reduced to approximately 2.5 volts by the voltage divider, which is approximately the center of the operating range of an exemplary comparator 240 operating from a 5-volt DC supply. In like manner, the resistors 222 and 254 operate as a voltage divider for the inverted signal applied to the inverting input terminal 224 of the first threshold detector circuit 220. The first threshold detector circuit 220 further includes a resistor 256 and a capacitor 258 connected in series between the output terminal 246 and the noninverting input terminal 242 of the comparator 240, and a resistor 260 connected between the output terminal 246 and a voltage supply shown as $V_S$. The output terminal 246 of the comparator 240 is connected to the output terminal 226 of the first threshold detector circuit 220.

Figure 7:
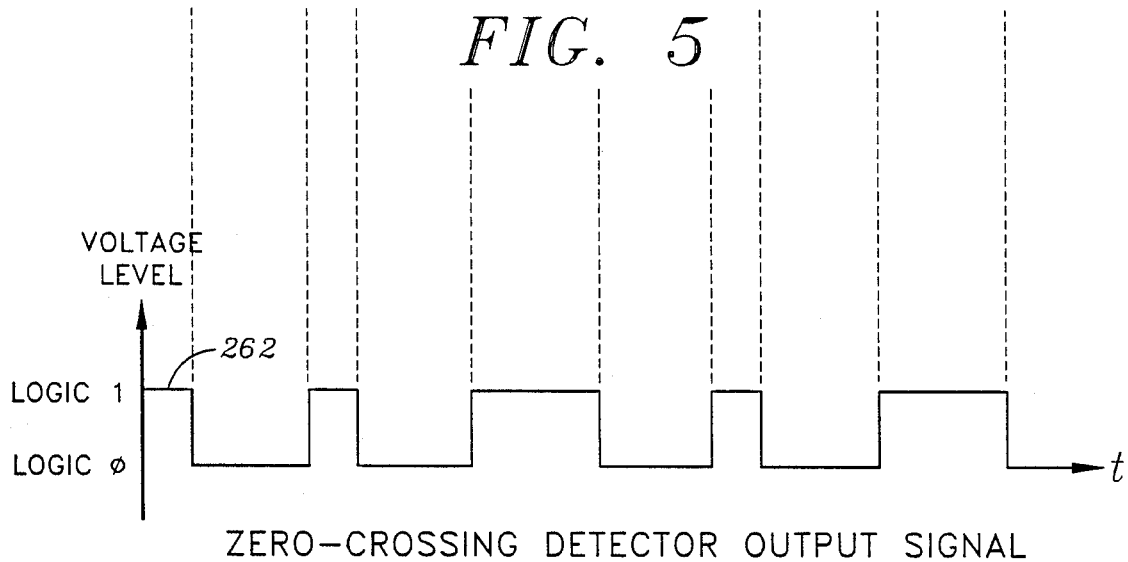
FIG. 7 illustrates a waveform that represents the voltage levels provided as outputs from the first threshold detector circuit of FIG. 6.

The first threshold detector circuit 220 operates in a conventional manner to provide a digital output signal on the output terminal 226 having two voltage levels. As illustrated by a waveform 262 in FIG. 7, the output signal switches from one of the two voltage levels to the other of the two voltage levels at each zero-crossing of the differential input signal provided to the input terminals 222 and 224 of the threshold detector circuit 220. For example, when the magnitude of the noninverted input signal is substantially equal to the magnitude of the inverted input signal, as illustrated by the "zero-crossings" 214 and 216 in FIG. 5, the output voltage on the output terminal 226 of the first threshold detector circuit 220 will switch from a low voltage level (e.g., a logical 0) to a high voltage level (e.g., a logical 1). Thus, it should be understood that the switching of the output voltage on the output terminal 226 is primarily dependent upon the differential voltage ($V_{DIF}$ in FIG. 5) between the noninverted input signal on the input terminal 222 and the inverted input signal on the input terminal 224. The series combination of the resistor 256 and the capacitor 258 provides AC hysteresis for the first threshold detector circuit 220 so that the output signal on the output terminal 226 will not switch in response to signal noise near the zero-crossings of the input signal.

The output of the first threshold detector circuit 220 is provided as the input to a decoder circuit 264 (shown in dashed lines) that generates a serial digital data stream in accordance with the timing of the zero-crossings detected by the threshold detector circuit 220. The operation of decoder circuits such as the decoder circuit 264 are well-known in the art and are beyond the scope of the present invention which is concerned with the generation of the zero-crossing signals that are provided as inputs to the decoder circuit 264.

One skilled in tee art related to magnetic recording will understand that there a number of variables associated with recording data on magnetic media that may prevent data recorded on the media from being successfully read from the media at a later time. Thus, in many recording devices, such as a magnetic tape drive, provision is made for verifying the integrity of the recorded data shortly after recording the data. For example, in exemplary magnetic tape drives, the data is recorded using a write head (not shown) and the data is read using the read head 110. The read head 110 is typically located a short distance from the write head so that a portion of the tape 114 (FIG. 1) onto which data is recorded passes proximate to the read head 110 shortly afterwards so that the data can be read. This technique is referred to as read after write data verification.

The data recorded on the tape 114 can be detected and verified using the first threshold detector 220 as described above to detect when the zero-crossings of the amplified and differentiated signals. However, the first threshold detector circuit 220 does not require a very large signal magnitude in order to operate. Thus, the first threshold detector circuit 220 is likely to provide correct output signal switching for data that is recorded on the tape 114 with low signal magnitude. When the same data is read by another tape unit or by the same tape unit at a later time, the recorded signal magnitudes may not be sufficient to provide correct output data. Thus, the second threshold detector circuit 230 is typically included to provide a means of testing the recorded data by requiring additional signal amplitude in order to switch the output signal provided on its output terminal 236. The output terminal 236 is also connected to the decoder circuit 264, and during read after write data verification the decoder 264 compares both the output of the first threshold detector 220 and the output of the second threshold detector 230 to verify that the data has been written with a sufficient magnitude that it is likely that the data can be read at a later time.

Figure 8:
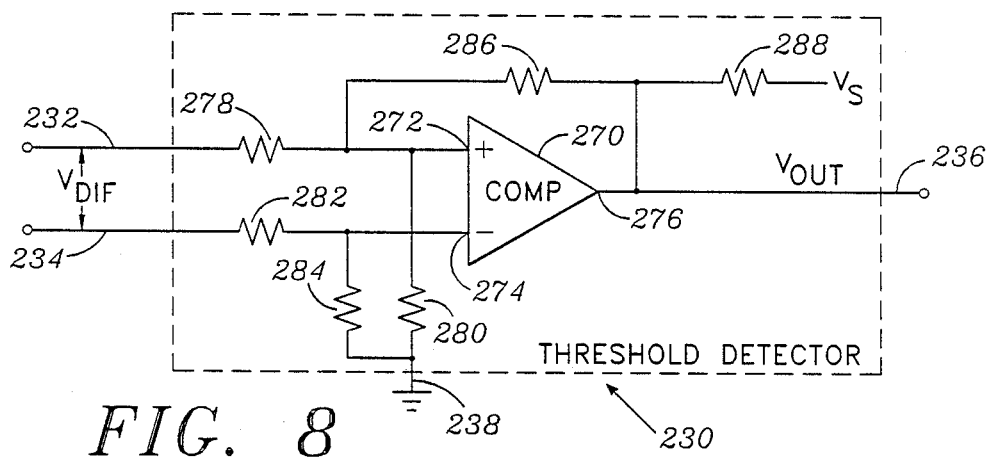
FIG. 8 illustrates a circuit diagram of an exemplary threshold detector circuit having hysteresis to provide voltage threshold margins.

In order to provide an offset threshold, the preferred embodiment of the second threshold detector circuit 230 includes DC hysteresis. The preferred embodiment of the threshold detector 230 is illustrated in FIG. 8. As illustrated in FIG. 8, the threshold detector 230 is similar to the threshold detector 220 of FIG. 6 in that it also includes a comparator 270 having a noninverting input terminal 272, an inverting input terminal 274 and an output terminal 276 that provides an output voltage $V_{OUT}$. The noninverting input terminal 272 of the comparator 270 is connected via a resistor 278 to the noninverting input terminal 232 and via a resistor 280 to the reference voltage input terminal 238 of the second threshold detector circuit 230. The inverting input terminal 274 of the comparator 270 is connected via a resistor 282 to the inverting input terminal 234 and via a resistor 284 to the reference voltage input terminal 238 of the second threshold detector circuit 230. As described above with respect to the first threshold detector circuit 220, the resistors 278, 280, 282 and 244 act as voltage dividers between the input terminals 232, 234 of the second threshold detector circuit and the respective input terminals 272, 274 of the comparator 270. As with the first threshold detector 220, the resistance values of the resistors 278, 280, 282 and 284 of the second threshold detector 230 are selected to provide input voltage levels to the comparator 270 that are proximate to the middle of the normal operating range of the comparator 270. Using the same example as above, when the voltage reference input terminal 238 of the second threshold detector circuit 230 is connected to the ground reference, the resistors 278, 280, 282 and 284 are advantageously selected to have equal resistances to reduce applied signals having a 5-volt DC component to a signal having a 2.5-volt DC component.

Unlike the first threshold detector circuit 220, the second threshold detector circuit 230 includes a feedback resistor 286 that is connected between the output terminal 276 and the noninverting input terminal 272 of the comparator 270. The second threshold detector circuit 230 further includes a pull-up resistor 288 from the output terminal 276 to a positive voltage supply (shown as $V_S$). The feedback resistor 286 provides feedback from the output terminal 276 back to the noninverting input terminal 272 of the comparator 270.

Figure 9:
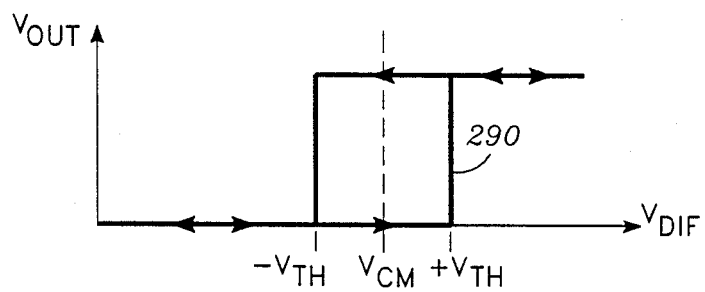
FIG. 9 illustrates the voltage transfer characteristic of the zero-crossing circuit of FIG. 8, showing the hysteresis effect that provides the noise immunity.

The feedback resistor 276, in combination with the pull-up resistor 278, operates to create a hysteresis effect in the voltage transfer characteristic between the differential input voltage and the output voltage. This hysteresis effect is illustrated by a transfer characteristic graph 290 in FIG. 9, wherein the horizontal axis represents the magnitude of the differential voltage $V_{DIF}$ between the two input signals at the noninverting input terminal 232 and the inverting input terminal 234 of the threshold detector 230. Note that this is not the same as the differential voltage between the noninverting input terminal 272 and the inverting input terminal 274 of the comparator 270. The vertical axis of the graph in FIG. 9 represents the output voltage $V_{OUT}$ on the terminal 236 of the threshold detector 230, corresponding to the voltage on the output terminal 276 of the comparator 270. As illustrated in FIG. 9, when the differential input voltage increases to a voltage $V_{TH+}$, the output voltage will switch from a low voltage level to a high voltage level (i.e., it will switch from a logical 0 to a logical 1 in accordance with the convention used herein). Further increases in the differential input voltage above the voltage $V_{TH+}$ have no effect on the output voltage. When the differential input voltage decreases to the voltage $V_{TH+}$, the output voltage does not switch back to the low voltage level. Rather, as illustrated in FIG. 9, the output voltage does not switch to the low voltage level until the differential input voltage decreases to a voltage $V_{TH-}$ which is sufficiently lower than the voltage $V_{TH+}$ that it is unlikely that noise on the input signals can cause switching between the two output voltage levels. Preferably, the two threshold voltages are symmetrically disposed around the common mode voltage $V_{CM}$ of the two input signals.

Figure 10:
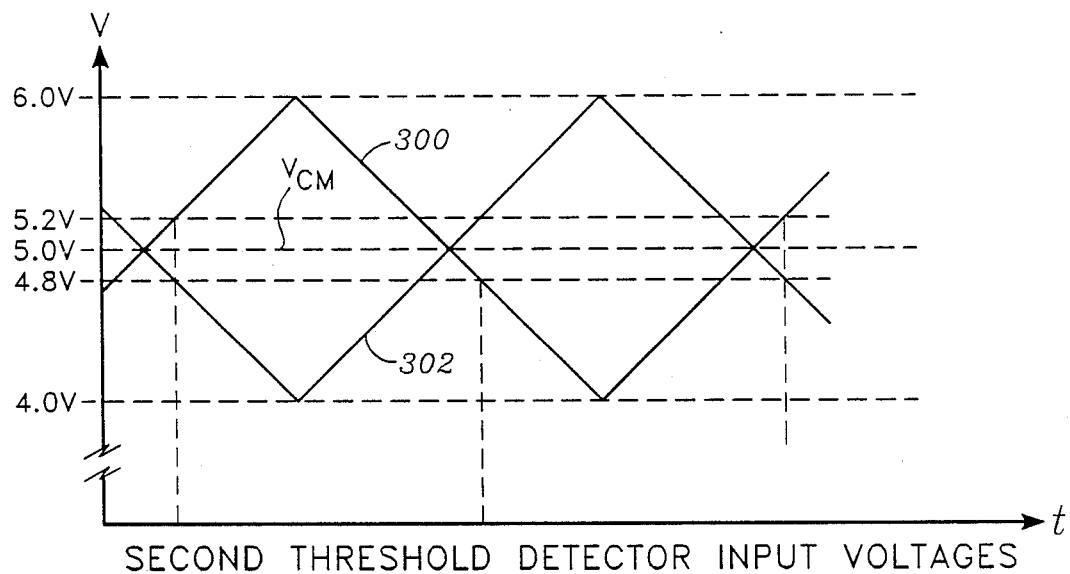
FIG. 10 illustrates a pair of triangle waveforms that represent simplified differential input signals applied to the inputs of the threshold detector circuit of FIG. 8.
Figure 11:
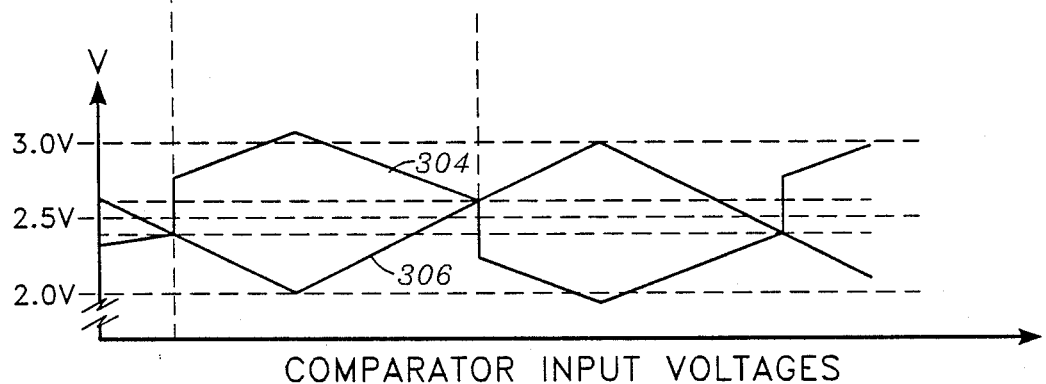
FIG. 11 illustrates the differential signals applied to the comparator of the threshold detector circuit of FIG. 8.
Figure 12:
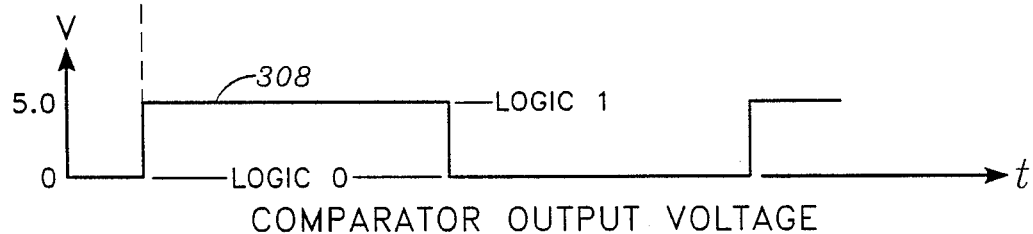
FIG. 12 illustrates the output signal from the threshold detector of FIG. 8, FIGS. 10 and 11 together showing the effect of the hysteresis to cause the output signal to switch at a non-zero differential voltage level between the two differential input signals.

The hysteresis effect is caused by the voltage divider action between the feedback resistor 286 and the resistors 278 and 280 connected to the noninverting input terminal 272 of the comparator 270. This effect is illustrated in FIGS. 10, 11 and 12 for a triangular waveform 300 and a triangular waveform 302 applied to the noninverting input terminal 232 and the inverting input terminal 234, respectively, of the threshold detector 230; a resulting triangular waveform 304 and a resulting triangular waveform 306 on the noninverting input terminal 272 and the inverting input terminal 274 of the comparator 270; and responsive digital output voltage signal 308 from the output terminal 236 of the threshold detector 230. (The triangular waveforms are used to simplify the following discussion. The operation of the circuit for the more complex waveforms such as one would find in the read circuit 100 will be substantially in accordance with the following discussion.) The two triangular waveforms 300 and 302 are shown as having a common mode voltage of 5.0 volts and an AC voltage swing of 2.0 volts peak-to-peak (i.e., each waveform has a one volt peak deviation each direction from the common mode voltage). In one exemplary threshold detector circuit 230, the feedback resistor 276 has a resistance value that is approximately four times the resistance value of the resistor 278 (e.g., the feedback resistor 280 may have a value of 30,000 ohms compared to a value of 5,000 ohms for the resistor 278). Thus, when the common mode voltage for the two differential input signals is approximately 5.0 volts (i.e., approximately equal to the voltage provided by a 5.0-volt regulated power supply) and the output voltage on the output terminal 276 of the comparator 270 is at zero volts, the feedback resistor 286 is effectively in parallel with the resistor 284. Thus, when the noninverted input signal and the inverted input signal applied to the noninverting input terminal 232 and the inverting input terminal 234 of the second threshold detector circuit 230 are equal (e.g., both have a magnitude of 5.0 volts), the voltage applied to the noninverting input 272 of the comparator 270 will be less than the voltage applied to the inverting input 274. Using the exemplary voltages and resistance values, it can be shown that the voltage applied to the noninverting input terminal 272 will be approximately 2.3 volts compared to the 2.5 volts applied to the inverting input terminal 274. Thus, the voltage on the output terminal 276 of the comparator 270 will not switch output voltage levels when the differential input voltage between the noninverting input terminal 232 and the inverting input terminal 234 of the threshold detector 230 is equal to zero. Rather, it can be shown that the output signal will not switch levels until the noninverted input signal on the noninverting terminal 232 is at approximately 5.2 volts and the inverted input signal on the inverting input terminal 234 is at approximately 4.8 volts and thus both the noninverted and the inverted input signals applied to the noninverting input terminal 272 and the inverting input terminal 274 of the comparator 270 are approximately 2.4 volts. Thus, assuming the exemplary peak AC voltage swing of 1.0 volt from the common mode voltage for the noninverted and inverted input signals, it can be seen that the exemplary resistance values provide a switching offset or threshold of approximately 20 percent of the expected voltage swing from the zero differential input. The pull-up resistor 288 is provided to assure that the output voltage is substantially equal to 5.0 volts when the output voltage is switched.

With the output voltage at the high voltage level, the second threshold detector circuit 230 provides the opposite hysteresis effect. When the two input voltages on the noninverting input terminal 232 and the inverting input terminal 234 of the second threshold detector circuit 230 are equal (i.e., both at 5.0 volts), the voltage on the noninverting input terminal 272 of the comparator 270 will be at approximately 2.7 volts compared to the 2.5 volts on the inverting input terminal 274. Thus, the output signal on the output terminal 276 of the comparator 270 will not switch. Rather, it can be shown that the output signal does not switch levels until the noninverted input signal on the noninverting input terminal 232 has a magnitude of approximately 4.8 volts and the inverted input signal on the inverting input terminal 234 has a magnitude of approximately 5.2 volts, at which time both voltages applied to the input terminals of the comparator 270 are at approximately 2.6 volts. Again, the output voltage does not switch until the too input voltages have reached approximately 20 percent of their maximum voltage swings in the opposite direction.

It can be seen from the foregoing that the successful operation of the second threshold detector circuit 230 of FIG. 8 depends upon the common mode offset voltage being substantially equal to a predetermined voltage. In addition, it is important that the when the differential voltage between the noninverted input signal on the noninverting input terminal 232 and inverted input voltage on the inverting input terminal 234 is substantially equal to zero, that this condition correspond to a zero-crossing in the output of the differentiating low-pass filter 150. It has been found, however, that in practice the components used in an exemplary read circuit 100, such as has been described above, are not perfect. One problem, for example, is that the noninverted output signal and the inverted output signal on the noninverting output terminal 206 and the inverting output terminal 208 of the differential amplifier 200 have a differential offset voltage between their DC components. That is, when the differential voltage between the noninverted input signal and the inverted input signal on the noninverting input terminal 202 and the inverting input terminal 204, respectively, of the differential amplifier 200 is zero, the differential voltage between the noninverted output signal and the inverted output signal from the differential amplifier 200 will be non-zero. The other problem that occurs is that the common mode DC components of the noninverted and inverted output signals from the differential amplifier 200 may not be known and may not remain constant.

Figure 14:
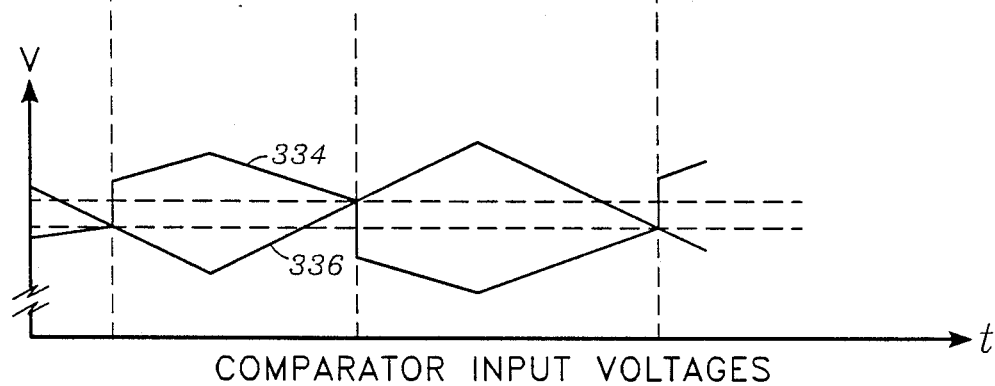
Figure 15:
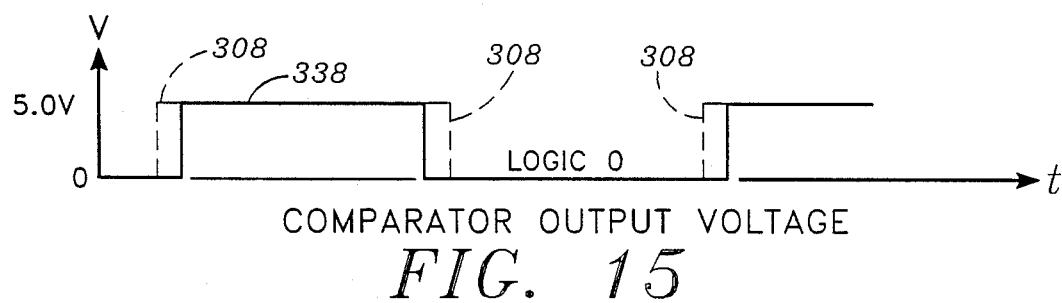

Both of these problems result in voltage inputs to the second threshold detector circuit 230 that are not biased at the center of the hysteresis effect in the voltage transfer characteristic of the second threshold detector circuit 230. The effect of these problems is an incorrect output from the second threshold detector circuit 230 with the transitions from the high level to the low level and from the low level to the high level spaced apart in time by amounts that do not correspond to the spacing of the zero-crossings from the differentiating low-pass filter 150. These effects are illustrated in FIGS. 13, 14 and 15 and in FIGS. 16, 17 and 18.

Figure 13:
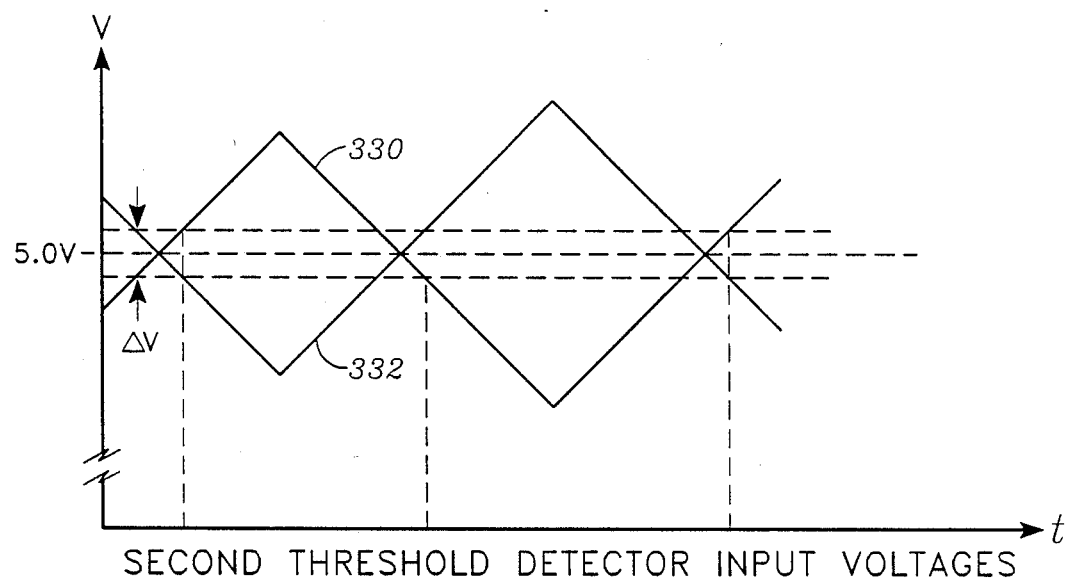
FIGS. 13, 14 and 15 illustrate waveforms that correspond to the waveforms in FIGS. 10, 11 and 12, respectively, which together show the effect on the output of the threshold detector circuit caused by a non-zero differential offset voltage between the outputs of the differential amplifier.

In FIG. 13, a triangular waveform 330 and a triangular waveform 332 represent the noninverted input signal and the inverted input signal, respectively, of the second threshold detector circuit 220 when the differential offset voltage is not equal to zero. These waveforms generally correspond to the input waveforms of FIG. 10; however, the effect of the non-zero differential offset voltage $\Delta V$ is illustrated. In FIG. 44, a waveform 334 represents the noninverted input signal applied to the noninverting input terminal 272 of the comparator 270, and a waveform 336 represents the inverted input signal applied to the inverting input terminal 274 of the comparator 270. In FIG. 15, a waveform 338 represents the output signal from the output terminal 276 of the comparator 270. Also shown in FIG. 15 is the waveform 308 superimposed in dashed lines. It can be seen that the output signal generated by the threshold detector 230 in response to the two input signals having a non-zero DC differential offset voltage $\Delta V$ does not correspond to the output signal represented by the waveform 308, and thus can cause erroneous data to be generated by the decoding circuit 240, particularly at high data rates wherein the time offsets between the leading and trailing edges of the signals may become a significant portion of the signal duration.

Figure 16:
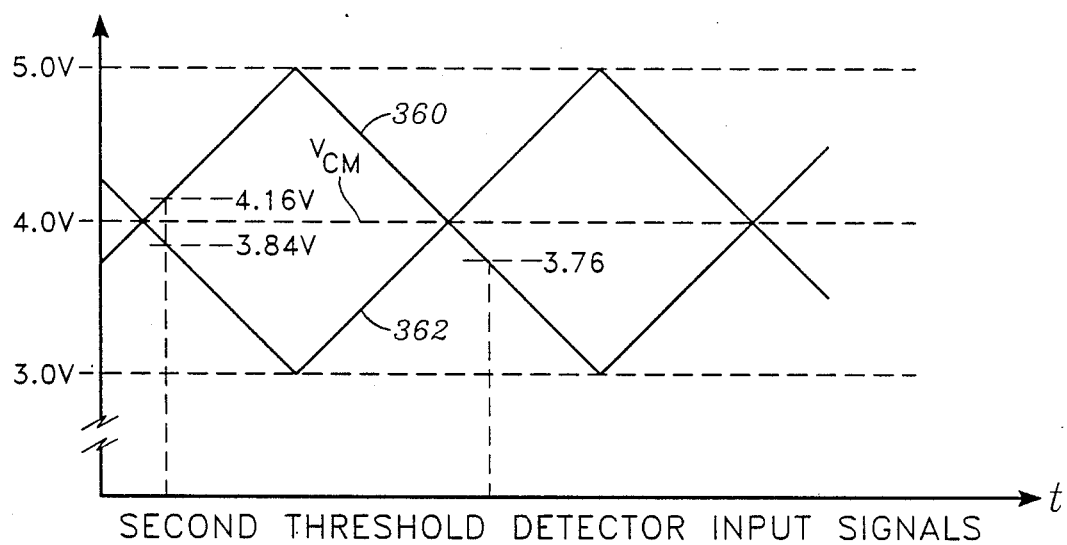
FIGS. 16, 17 and 18 illustrate waveforms that correspond to the waveforms in FIGS. 10, 11 and 12, respectively, which together show the effect on the output of the threshold detector circuit caused by a change in the magnitude of the common mode voltage of the outputs of the differential amplifier.
Figure 17:
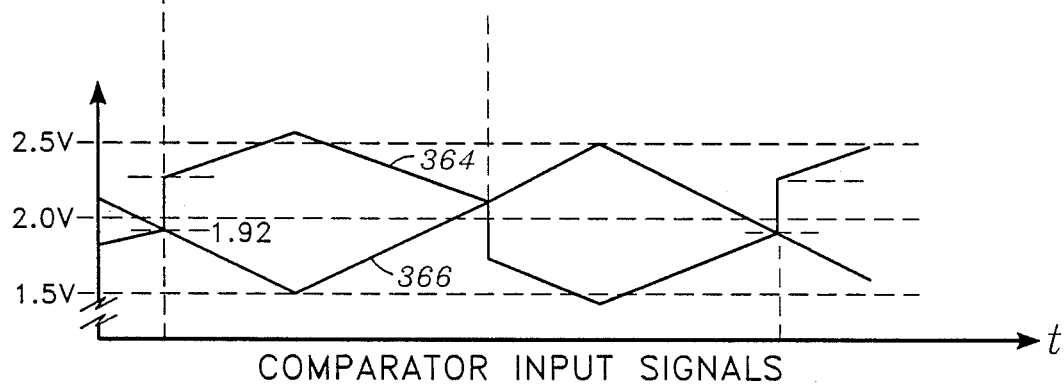
Figure 18:
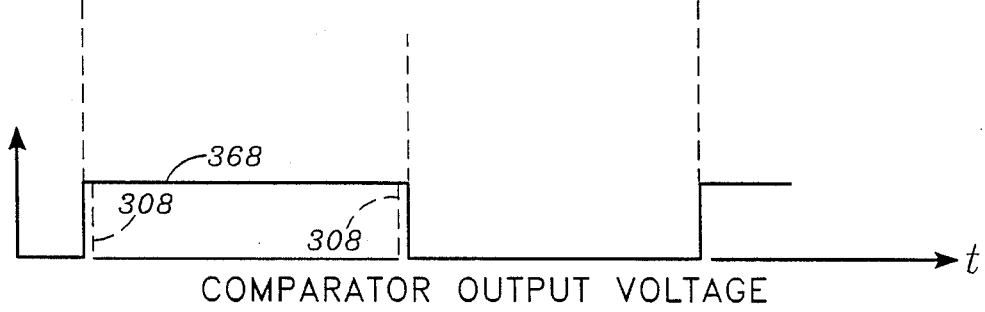

In FIG. 16, a waveform 360 and a waveform 362 represent the noninverted and inverted input signals of the second threshold detector circuit 330 when the common mode voltage $V_{CM}$ is less than the common mode voltage of the waveforms of FIG. 10 (e.g., the common mode voltage is 4.0 volts rather than 5.0 volts). In FIG. 18, a waveform 364 represents the noninverted input voltage applied to the noninverting input terminal 272 of the comparator 270, and a waveform 366 represents the inverted input voltage applied to the inverting input terminal 274 of the comparator 270. In FIG. 18, a waveform 368 represents the comparator output voltage to show the switching of the output voltage when the comparator input signals of FIG. 17 are substantially equal. The waveform 308 is superimposed in dashed lines to show where the output signal switches in accordance with FIG. 12. It can be seen that the output signal generated by the threshold detector 230, as represented by the waveform 364, does not correspond to the output signal represented by the waveform 304, and thus potentially can cause erroneous data to be generated by the decoding circuit 240. Furthermore, it can be seen that the second threshold comparator circuit 230 has a different threshold percentage when the noninverting input signal is increasing than it has when the noninverting input signal is decreasing. For example, when the noninverting input signal is increasing, the output signal switches when the noninverting input signal is at approximately 4.16 volts, which corresponds to a threshold percentage of approximately 16 percent of the one-volt voltage swing from the common mode voltage of 4.0 volts. On the other hand, when the noninverting input signal is decreasing, the output voltage does not switch until the noninverting input signal reaches 3.76 volts, which corresponds to a threshold percentage of approximately 24 percent of the one-volt peak swing. The difference in the threshold percentages is undesirable.

Figure 19:
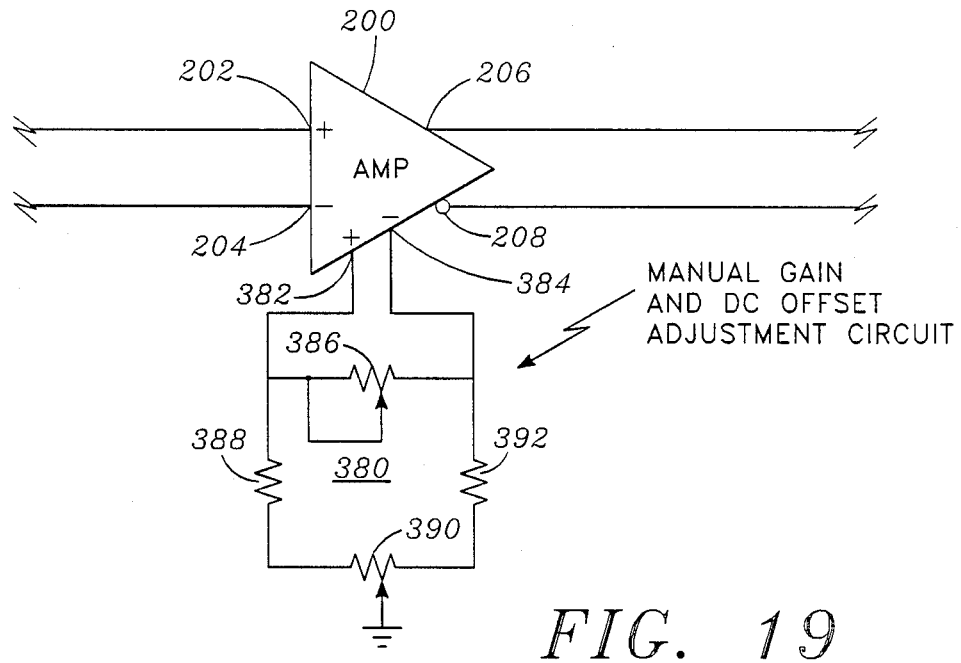
FIG. 19 illustrates a known variable resistance network for manually adjusting the differential offset voltage between the noninverting and inverting outputs of an exemplary differential amplifier.

One method of nullifying the differential offset voltage between the noninverted output signal on the noninverting output terminal 206 and the inverted output signal on the inverting output terminal 208 of the differential amplifier 200 is to add a variable resistor network 380 to connect a pair of gain and offset adjustment input terminals 382 and 384 of the exemplary differential amplifier 200 to a ground reference as illustrated in FIG. 19. It is known that the resistance between the two gain and offset adjustment input terminals 382 and 384 can be varied by a variable resistor 386 to adjust the gain of the differential amplifier 200. It is further known that the resistance between one of the gain and offset adjustment terminals and a ground reference can be varied relative to the resistance between the other gain and offset adjustment terminal and the ground reference vary the DC component of the inverting output signal relative to the noninverting output signal to substantially null the differential offset voltage between the noninverting output terminal 206 and the inverting output terminal 208. For example, as illustrated in FIG. 19, the positive gain and offset adjustment terminal 382 is connected to the ground reference by a resistor 388 in series with a first portion of a potentiometer 390, and the negative gain and offset adjustment terminal 384 is connected to the ground reference by a resistor 392 in series with a second portion of the potentiometer 390. By adjusting the potentiometer 390, the resistances between the two gain and offset adjustment terminals and the ground reference ar varied with respect to each other so as to vary the relative DC differential offset voltage between the two output signals. However, this method requires a manual adjustment of the potentiometer and is likely to require additional adjustments to compensate for variations in the differential amplifier with time and temperature. Furthermore, this method does not necessarily provide a solution to the common mode voltage problem. Thus, as previously stated, a need exists for a circuit that automatically maintains the differential offset voltage at a substantially zero magnitude and that restores the common mode voltage of the output signals from the differential amplifier 200 to a known reference voltage.

Description of the Present Invention

The present invention comprises a compensation circuit that is used in combination with the above-described read circuit 100 to provide an improved read circuit that solves both the problem of the differential offset voltage between the noninverted and inverted output signals from the video amplifier and the problem related to the effect of an unknown common mode DC voltage level. The compensation circuit of the present invention nullifies the differential offset voltage between the noninverted and inverted output signals generated by the differential amplifier 200. The compensation circuit of the present invention also sets the common mode DC voltage of the two outputs to a known reference voltage.

Figure 20:
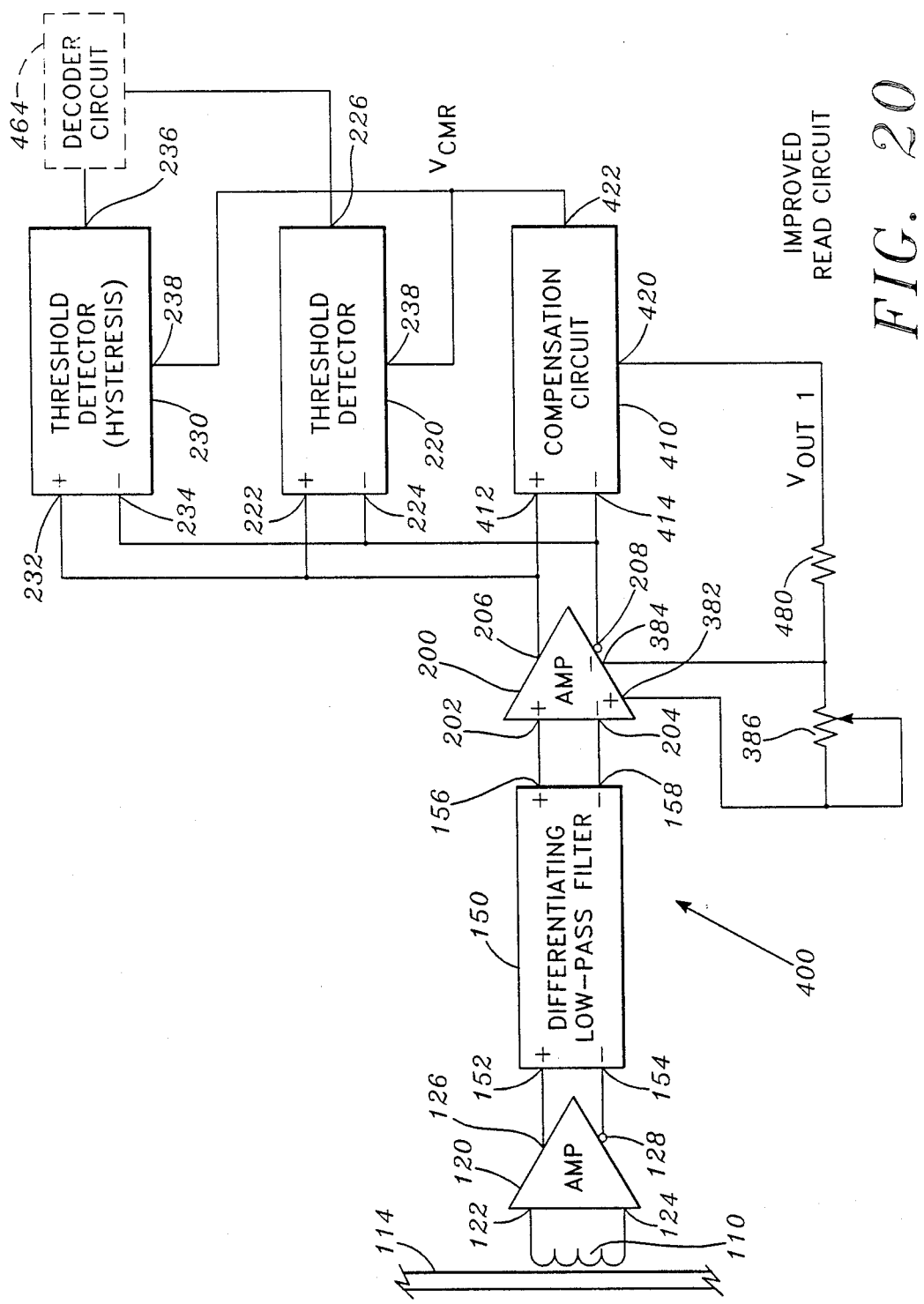
FIG. 20 illustrates a block diagram of an improved tape drive read circuit that incorporates a preferred embodiment of a compensation circuit in accordance with the present invention to provide automatic adjustment of the differential offset voltage and the common mode voltage of the differential signals provided as inputs to the threshold detector to eliminate the need for manual compensation adjustment of the differential amplifier.

The present invention can be best understood by referring to FIG. 20 which is a block diagram that illustrates an improved read circuit 400 that incorporates the compensation circuit of the present invention. The improved read circuit 400 includes the elements of the above-described read circuit 100 of FIG. 1, and the elements of FIG. 20 corresponding to like elements of FIG. 1 have the same numeric designators as the corresponding elements of FIG. 1.

As illustrated, the circuit 400 of FIG. 20 differs from the circuit 100 of FIG. 1 in that the circuit 400 includes a compensation circuit 410 connected to the output terminals 206 and 208 of the differential amplifier 200. In particular, the compensation circuit 410 includes a noninverting input terminal 412 that is connected to the noninverting output terminal 206 of the differential amplifier 200 and an inverting input terminal 414 that is connected to the inverting output terminal 208 of the differential amplifier 200. The compensation circuit 410 further includes a feedback output terminal 420 that is electrically connected to one of the gain and offset adjustment input terminals 382 or 384 (e.g., the terminal 384) of the differential amplifier 200, as will be described more fully below. The compensation circuit 410 includes a common mode voltage restoration output terminal 422 that is connected to the voltage reference input terminal 228 of the first threshold detector circuit 220 and to the voltage reference input terminal 238 of the second threshold detector circuit 230.

As will be described below, the compensation circuit 410 operates continually adjust the DC differential offset between the noninverted and inverted output signals from the differential amplifier 200 to substantially remove any differential offset voltage that may exist between the differential input signals on the input terminals 412 and 414. The compensation circuit 410 also provides a common mode restoration voltage $V_{CMR}$ on the common mode restoration voltage output terminal 422 that is responsive to the common mode voltage of the differential output signals from the differential amplifier 200 and that continually adjusts the voltage applied to the voltage dividers in the first and second threshold detectors 220 and 222 so that the differential voltages applied to the comparators 240 and 270 have a known, substantially constant DC voltage component. In the preferred embodiment described herein, the compensation circuit 410 provides a known common mode restoration voltage which is selected to be substantially equal to one-half the supply voltage (e.g., 2.5 volts for a 5.0 volt supply) so that the threshold detector 230 will operate in the manner described above.

Figure 21:
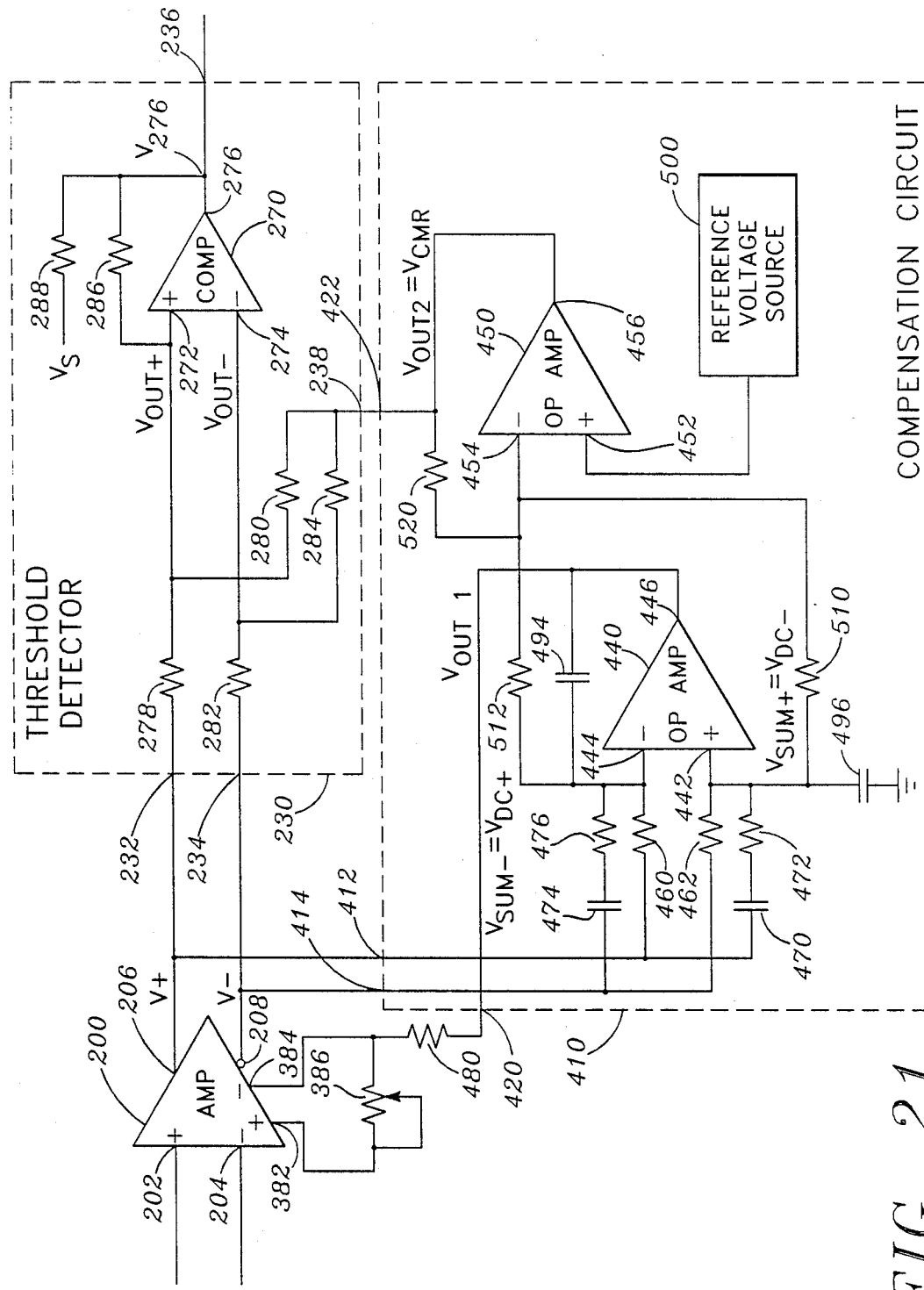
FIG. 21 is a schematic diagram illustrating a preferred embodiment of the compensation circuit of the present invention, and further showing the differential amplifier and the second threshold detector circuit and their respective interconnections to the compensation circuit.

FIG. 21 is a schematic diagram that illustrates the preferred embodiment of the compensation circuit 410 of the present invention, and which also illustrates the differential amplifier 200. As discussed above, the differential amplifier 200 provides a pair of differential signals as outputs on the output terminals 206 and 208. The noninverted output signal on the noninverting output terminal 206 is shown as V+ and comprises a DC component ($V_{DC+}$) and an AC component ($V_{AC+}$), where the + sign as a suffix indicates a reference to the noninverted output signal. The foregoing can be expressed mathematically as:

$$V+ = V_{DC+} + V_{AC+} \qquad (1)$$

The inverted output signal on the inverting output terminal 208 is shown as V− and comprises a DC component ($V_{DC-}$) and an AC component ($V_{AC-}$), where the - sign as a suffix indicates a reference to the inverted output signal. This can be expressed mathematically as:

$$V- = V_{DC-} + V_{AC-} \qquad (2)$$

Figure 22:
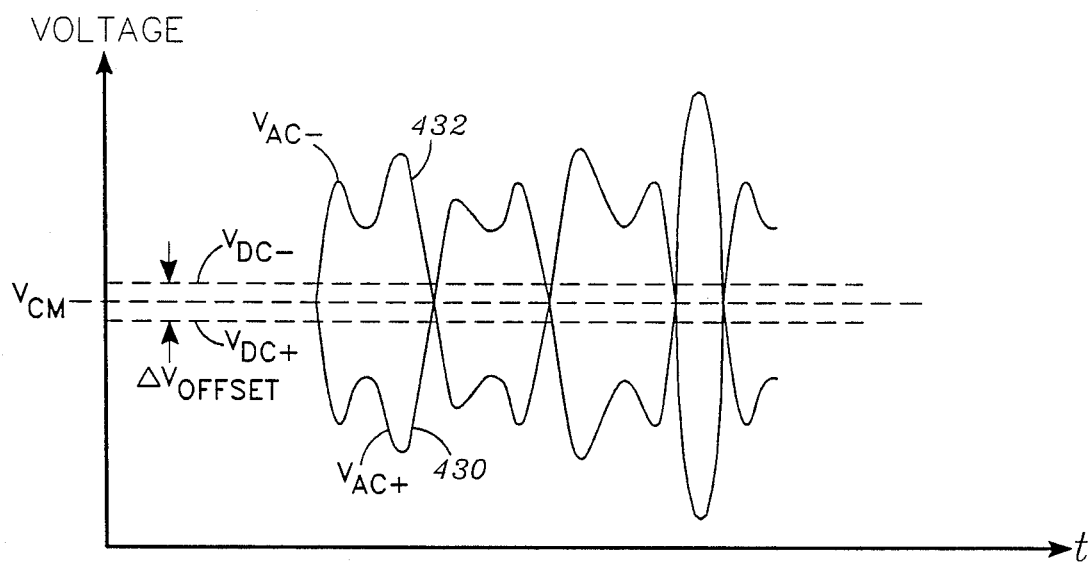
FIG. 22 illustrates a pair of waveforms that represent the differential output signals from the differential amplifier of FIG. 21 that are applied to the compensation circuit of FIG. 21.

The DC component of each of the two signals represents the average voltage about which the AC component of the two signals swings. The foregoing is illustrated in FIG. 22 by a waveform 430, representing the noninverted output signal and a waveform 432 representing the inverted output signal. As illustrated in FIG. 22, the noninverted output signal has a DC+ component that differs from the DC− component by an amount shown as $\Delta V_{OFFSET}$. Mathematically, the foregoing can be expressed as:

$$\Delta V_{OFFSET} = V_{DC+} - V_{DC-} \quad (3)$$

$\Delta V_{OFFSET}$ can be either positive or negative, depending upon whether $V_{DC+}$ or $V_{DC-}$ has a greater magnitude.

Although, ideally, the differential offset voltage between the two output signals would be zero when the differential input signal is zero, due to the imperfect nature of the video amplifier used for the differential amplifier 200, the differential offset voltage $\Delta V_{OFFSET}$ between the two signals is not zero, as illustrated. The common mode voltage $V_{CM}$ is the average value of the two DC components:

$$V_{CM} = (V_{DC+} + V_{DC-})/2 \quad (4)$$

Ideally, the common mode voltage $V_{CM}$ should be a predetermined magnitude so that the operation of the zero-crossing circuit 230 can be designed to work with the predetermined common mode voltage magnitude. However, as discussed above, the common mode voltage will vary from one video amplifier circuit to another circuit, and is likely to vary with changes in temperature and over a period of time.

It should also be understood that the AC components of the noninverted and inverted output signals generated by the differential amplifier 200 should be substantially equal and opposite to each other. Thus:

$$V_{AC+} = V_{AC-} \quad (5)$$

Returning to FIG. 21, the compensation circuit 410 includes a first operational amplifier 440 having a noninverting input terminal 442, an inverting output terminal 444 and an output terminal 446. The compensation circuit 410 further includes a second operational amplifier 450 having a noninverting input terminal 452, an inverting input terminal 454 and an output terminal 456. In the preferred embodiment, the two operational amplifiers 440 and 450 are LM324 operational amplifiers, manufactured by National Semiconductor, or the like.

A series resistor 460 is connected between the noninverting input terminal 412 of the compensation circuit 410 and the inverting input terminal 444 of the first operational amplifier 440. Thus, the inverting input terminal 444 of the first operational amplifier 440 is DC-coupled to receive a signal responsive to the noninverted output signal from the differential amplifier 200. Since this signal is DC-coupled, the signal provided to the inverting input terminal 444 is responsive to both the $V_{DC+}$ and the $V_{AC+}$ components of the inverted signal output from the differential amplifier 200.

In like manner, a series resistor 462 is connected between the inverting input terminal 414 of the compensation circuit 410 and the noninverting input terminal 442 of the first operational amplifier 440. Thus, the noninverting input terminal 442 of the first operational amplifier 440 is DC-coupled to receive a signal responsive to the inverted output signal from the differential amplifier 200. Since this signal is also DC-coupled, the signal provided to the noninverting input terminal 442 is responsive to both the $V_{DC-}$ and the $V_{AC-}$ components of the noninverted signal output from the differential amplifier 200.

The noninverting input terminal 442 of the first operational amplifier 440 is further connected to the noninverting input terminal 412 of the compensation circuit 410 via a series connected combination of a capacitor 470 and a resistor 47 so as to receive an AC-coupled signal responsive to the noninverted output signal from the differential amplifier 200. This signal is referred to as $V_{AC+}$, as discussed above.

In like manner, the inverting input terminal 444 of the first operational amplifier 440 is connected to the inverting terminal 414 of the compensation circuit 410 via a series connected combination of a capacitor 474 and a resistor 476 so as to receive an AC-coupled signal responsive to the inverted output signal from the differential amplifier 200. This signal is referred to as $V_{AC-}$, as discussed above.

It can be seen that the AC-coupled signals and the DC-coupled signals are summed at the input terminals of the first operational amplifier 440. In the preferred embodiment described herein, the resistor 460, the resistor 462, the resistor 472 and the resistor 476 have equal magnitudes (e.g., 10,000 ohms) so that the currents summed at the input terminals of the first operational amplifier 440 are directly proportional to the corresponding output voltages provided by the differential amplifier 200. Thus, the voltage input to the noninverting input terminal 442 of the first operational amplifier 440 is referred to as $V_{SUM+}$ and is expressed mathematically as:

$$V_{SUM+} = V_- + V_{AC+} = (V_{DC-} + V_{AC-}) + V_{AC+} \quad (6)$$

Since, from the Equation ((5) above, $V_{AC+}$ is equal to $V_{AC-}$, the Equation (6) can be reduced to:

$$V_{SUM+} = V_{DC-} \quad (6')$$

In like manner, the voltage input to the inverting input terminal 444 of the first operational amplifier 440 is referred to as $V_{SUM-}$ and is expressed mathematically as:

$$V_{SUM-} = V_+ + V_{AC-} = (V_{DC+} + V_{AC+}) + V_{AC-} \quad (7)$$

Again, since $V_{AC+}$ is equal to $V_{AC-}$, the Equation (7) can be reduced to:

$$V_{SUM-} = V_{DC+} \quad (7')$$

Thus, the differential input terminals 442 and 444 of the first operational amplifier 440 are presented with a pair of DC signals that are summed by the first operational amplifier 440 to provide an output signal $V_{OUT1}$ on the output terminal 446 that is a function of $\Delta V_{OFFSET}$. In other words:

$$V_{OUT1} = f(V_{SUM+} - V_{SUM-})$$
$$= f(V_{DC-} - V_{DC+}) = f(-k\Delta V_{OFFSET}) \quad (8)$$

where f represents a function that is determined by the characteristics of the first operational amplifier 440, its associated circuit components, and the characteristics of the differential amplifier 200.

As illustrated in FIG. 21, the output terminal 446 of the first operational amplifier 440 is electrically connected via a series resistor 480 (having a resistance, for example, of 100,000 ohms) to the feedback output terminal 420 of the compensation circuit 410, and is thus connected to a selected one of the gain and offset adjustment input terminals 382 and 384 of the differential amplifier 200. For example, in the embodiment of FIG. 21, the output terminal 446 of the first operational amplifier 440 is connected to the negative gain and offset adjustment input terminal 384. As discussed above, the variable resistor 386 is provided between the positive gain and offset adjustment input terminal 382 and the negative gain and offset adjustment input terminal 384 to adjust the gain of differential amplifier. The variable resistor 386 also provides an additional resistance between the positive gain and offset adjustment input terminal 382 and the output terminal 446 of the first operational amplifier 440 so that the voltage on the output of the first operational amplifier has a greater effect on the negative gain and offset adjustment input terminal 384 than on the positive gain and offset adjustment input terminal 382. When the output signal $V_{OUT1}$ increases in magnitude as a result of an increased differential offset voltage between the noninverted output signal and the inverted output signal from the differential amplifier 200 (e.g., the $V_{DC-}$ component of the inverted output signal increasing in magnitude relative to the $V_{DC+}$ component of the noninverted output signal), the increased voltage is applied to the negative gain add offset adjustment input terminal 384 to decrease the magnitude of the inverted output signal relative to the noninverted output signal until the $V_{DC+}$ and the $V_{DC-}$ components are substantially equal, thus reducing the magnitude of the differential offset voltage $\Delta V_{OFFSET}$ to substantially zero volts. In like manner, when the output voltage $V_{OUT1}$ decreases as the magnitude of the $V_{DC-}$ component decreases relative to the $V_{DC+}$ component, the decreased voltage applied to the negative gain and offset adjustment terminal 384 increases the magnitude of the noninverted output signal relative to the inverted output signal, thus again reducing the magnitude of the differential offset voltage $\Delta V_{OFFSET}$. It can be seen that the first operational amplifier 440 will operate to maintain the differential voltage at its input at substantially zero volts, and will thus operate to maintain the differential offset voltage $\Delta V_{OFFSET}$ between the noninverting and the inverting output terminals 206 and 208 of the differential amplifier 200 at substantially zero volts.

As further illustrated in FIG. 21, the compensation circuit 410 includes a capacitor 494 that is electrically connected between the output terminal 446 and the inverting input terminal 444 of the first operational amplifier 440. The capacitor 494 operates as a filter capacitor to reduce the rate at which the output voltage $V_{OUT1}$ changes in response to transient noise on the inverting input terminal 444. A second filter capacitor 496 is connected between the noninverting input terminal 442 and the ground reference to provide filtering for the noninverting input terminal 442 and to provide balanced capacitive loading for the inverted output signal and the noninverted output signal from the differential amplifier 200. In the preferred embodiment, the filter capacitors 494 and 496 and the series capacitors 470 and 474 have capacitance values of 0.1 microfarad.

It can be seen that the first operational amplifier 440, together with the associated resistors and capacitors, operates as a simple low-pass active filter that provides real-time compensation for any differential offset voltages between the noninverted and inverted output signals from the differential amplifier 200. Since the compensation is active, there is no need for initial manual adjustment of the differential offset voltage, nor is there any need to make future adjustments in response to component aging or changes caused by temperature. Thus, the compensation circuit 410 of FIG. 21 provides an elegant solution to the above-described problem with the non-zero differential offset voltage.

As set forth above, the noninverted and inverted output signals from the differential amplifier 200 are provided as inputs to the first threshold detector 220 and the second threshold detector 230. Since the DC differential offset voltage between the two signals has been controlled to have a substantially zero magnitude, the first threshold detector circuit 220 will operate substantially in accordance with the description of its operation set forth above. That is, the first threshold detector circuit 220 will provide an output signal on the output terminal 226 that switches levels when the two input signals have substantially the same magnitude which now corresponds to the actual zero-crossings.

On the other hand, common mode voltage of the noninverted and inverted signals from the differential amplifier 200 has an unknown magnitude. Therefore, the operation of the second threshold detector circuit 230 will vary in accordance with the magnitude of the common mode voltage. Since this is an undesirable condition, the compensation circuit 410 includes additional circuitry to compensate for variations in the common mode voltage of the two output signals from the differential amplifier 200. Since this aspect of the invention is primarily concerned with the operation of the second threshold detector circuit 230, the second threshold detector circuit 230 is shown in FIG. 21 to assist in describing the operation of this aspect of the invention.

As set forth above, the noninverted and inverted output signals of the differential amplifier 200 are provided as inputs to the second threshold detector circuit 230 via the resistor 278 and the resistor 282, respectively. The resistor 278 operates as a voltage divider in combination with the resistor 280 which is in turn connected to the reference voltage input terminal 238. In like manner, the resistor 282 operates as a voltage divider in combination with the resistor 282 which is also connected to the reference voltage input terminal 238. Unlike FIG. 8 described above, the reference voltage input terminal 238 is not connected to the ground reference. Rather, the reference voltage input terminal 238 is connected to the common mode restoration voltage output terminal 422. For convenience in describing the operation of the restoration voltage generation portion of the circuit, the voltage at the common junction of the resistor 278, the resistor 280 and the noninverting input terminal 272 of the comparator 270 will be referred to as $V_{OUT+}$; and the voltage at the common junction of the resistor 282, the resistor 284 and the inverting input terminal 274 of the comparator 270 will be referred to as the $V_{OUT-}$. In the preferred embodiment of the present invention, the resistances of the resistors 278 and 282 are approximately 5,000 ohms, the resistances of the resistors 280 and 284 are approximately 2,500 ohms, and the resistance of the feedback resistor 286 is approximately 30,000 ohms.

The voltage divider networks in combination with the second operational amplifier 450 and its associated circuit components provide a solution for the common mode voltage problem, as will be discussed below.

The noninverting input terminal 452 of the second operational amplifier 450 is connected to a DC reference voltage source 500 that provides a known, predetermined DC output reference voltage having the magnitude $V_{REF}$. For example, the reference voltage source 500 may be a Zener diode, a regulated reference voltage, or the like. As discussed above, in preferred embodiments of the present invention, the reference voltage $V_{REF}$ is equal to approximately one-half the supply voltage (e.g., 2.5 volts for a 5.0 volt supply voltage). The inverting input terminal 454 of the second operational amplifier 450 is connected via a series resistor 510 to the noninverting input terminal 442 of the first operational amplifier 440 and via a series resistor 512 to the inverting input terminal 444 of the first operational amplifier 440. The inverting input terminal 454 of the second operational amplifier 450 thus receives a signal that is proportional to the common mode voltage output of the differential amplifier 200. Since the operation of the first operational amplifier 440 causes the signals on both the input terminals 442 and 444 of the first operational amplifier 440 to be substantially equal, it is only necessary that a connection to one input terminal be provided. However, by providing both connections, as shown in FIG. 21, both the noninverted and the inverted signal outputs from the differential amplifier 200 are loaded substantially equally. In the preferred embodiment, the series resistors 510 and 512 have a very high impedance (e.g., 500,000 ohms) and thus do not significantly load either of the outputs of the differential amplifier 200.

The second operational amplifier 450 provides an output signal $V_{OUT2}$ on the output terminal 456. A feedback resistor 520 is connected the output terminal 456 of the second operational amplifier 450 back to the inverting input terminal 454 of the second operational amplifier 450 to feed a signal back to the inverting input terminal 454 that is proportional to the output signal $V_{OUT2}$. In the preferred embodiment of the present invention, the feedback resistor 520 has a resistance of approximately 125,000 ohms. The resistance of the feedback resistor 520 is selected to be approximately equal to one-fourth the resistance of each of the series resistors 510 and 512 and is thus approximately equal to one-half the total resistance from the noninverting and inverting input terminals 442 and 444 of the first operational amplifier 440. It should be noted that this ratio is the same as the ratio of the resistances in the voltage divider networks in this embodiment. The voltage $V_{OUT2}$ is also referred to as the common mode restoration voltage, abbreviated as $V_{CMR}$, and is provided as an output from the compensation circuit 410 on the common mode restoration voltage output terminal 422 and is thus connected to the reference voltage input terminal 438 of the second threshold detector 430.

The common mode restoration voltage generated by the second operational amplifier 440 operates in conjunction with the voltage divider resistors 278, 280, 282 and 284 to provide a DC common mode voltage on the noninverting input terminal 272 and the inverting input terminal 274 of the comparator 270 that is determined by the common mode voltage output of the differential amplifier 200 on the noninverting output 206 and the output voltage $V_{OUT2}$ on the output terminal 456 of the second operational amplifier 450. As will be described below, the common mode restoration voltage ($V_{OUT2}$ or $V_{CMR}$) is varied so that the common mode voltage on the input terminals of the comparator 270 has a substantially constant predetermined magnitude.

It can be seen that the voltage $V_{OUT2}$ provided on the output terminal 456 of the second operational amplifier 450 will be determined by the voltages $V_{SUM+}$ and $V_{SUM-}$ and the reference voltage $V_{REF}$. As set forth above, the first operational amplifier 440 operates to cause the voltages $V_{SUM+}$ and $V_{SUM-}$ to be substantially equal to each other and to be substantially equal to the DC component of the noninverted and inverted output signals generated by the differential amplifier 200. Thus, the output of the second operational amplifier 450 will be determined by the common mode output voltage from the differential amplifier 200. This common mode output voltage will be referred to hereinafter as $V_{DC\pm}$.

As is known in the art, the feedback resistor 520 from the output terminal 456 to the inverting input terminal 454 of the second operational amplifier 45 will cause the output voltage $V_{OUT2}$ generated by the second operational amplifier 450 to have a magnitude that causes the voltage on its inverting input terminal 454 to be substantially equal to the reference voltage $V_{REF}$ on its noninverting input terminal 452. The operation of the second operational amplifier 450 can be expressed mathematically as follows:

$$\frac{V_{SUM+} - V_{REF}}{R_{510}} + \frac{V_{SUM-} - V_{REF}}{R_{512}} = \frac{V_{REF} - V_{OUT2}}{R_{520}} \quad (9)$$

where $R_{510}$, $R_{512}$ and $R_{520}$ are the resistances of the resistor 510, the resistor 512 and the resistor 520, respectively. Since $V_{SUM+}$ is equal to $V_{SUM-}$, and both are equal to $V_{DC\pm}$, and since R510 is equal to R512 and is equal to four times R520, the Equation (9) can be simplified to:

$$\frac{V_{DC\pm} - V_{REF}}{2R_{520}} = \frac{V_{REF} - V_{OUT2}}{R_{520}} \quad (10)$$

The Equation (10) further simplifies to:

$$V_{OUT2} = \frac{3V_{REF} - V_{DC\pm}}{2} \quad (11)$$

It can be seen from Equation (11) that the output voltage $V_{OUT2}$ provided by the second operational amplifier 450 increases when $V_{DC\pm}$ decreases, and vice versa. Thus, the output voltage $V_{OUT2}$ increases when the common mode voltage of the noninverted and inverted output signals from the differential amplifier 200 decreases, and vice versa. The output voltage from the second operational amplifier 450 is also referred to as the common mode restoration voltage $V_{CMR}$ and is used to restore the common mode voltage of the noninverted and inverted output signals to the predetermined reference voltage $V_{REF}$, as described below.

As set forth above, the noninverted signal $V_{OUT+}$ at the noninverting input terminal 272 of the comparator 270 and the inverted signal $V_{OUT-}$ on the inverting output terminal 274 of the comparator 270 are responsive to the output voltages V+ and V− on the noninverting output terminal 206 and the inverting output terminal 208, respectively, from the differential amplifier 200 and to the output voltage $V_{OUT2}$ from the second operational amplifier 450. Mathematically, the foregoing can be expressed as follows:

$$V_{OUT+} = \frac{V+(R_{280}R_{286}) + V_{OUT2}(R_{278}R_{286}) + V_{276}(R_{278}R_{280})}{(R_{280}R_{286}) + (R_{278}R_{286}) + (R_{278}R_{280})} \quad (12)$$

$$V_{OUT-} = V_{OUT2} + \left(\frac{R_{284}}{R_{282} + R_{284}}\right)(V- - V_{OUT2}) \quad (13)$$

where $R_{278}$ is the resistance of the resistor 278, $R_{280}$ is the resistance of the resistor 280, $R_{282}$ is the resistance of the resistor 282, $R_{284}$ is the resistance of the resistor 284, $R_{286}$ is the resistance of the resistor 286, and $V_{276}$ is the output voltage on the output terminal 276 of the comparator 270. As set forth above, the resistances of the resistors 278 and 282 are approximately twice the resistance of the resistors 280 and 284, and the resistance of the resistor 286 is approximately 12 times the resistance of the resistors 280 and 284. Thus, the Equations (12) and (13) can be simplified to:

$$V_{OUT+} = (1/19)[(6V+) \cdot 12V_{OUT2} + V_{276}] \quad (14)$$

$$V_{OUT-} = V_{OUT2} + (1/3)(V- - V_{OUT2})$$
$$= (2/3)V_{OUT2} + (1/3)V- \quad (15)$$

Now using the definition of $V_{OUT2}$ from the Equation (11), the Equations (14) and (15) further simplify to:

$$V_{OUT+} = (1/19)[(6V+) + 12(3V_{REF} - V_{DC\pm})/2 + V_{276}] = (1/19)[(6V+) + 18V_{REF} - 6V_{DC\pm} + V_{276}] \quad (16)$$

$$V_{OUT-} = (1/3)(3V_{REF}/2 - V_{DC\pm}) + (1/3)V- \quad (17)$$

As further set forth above in the Equation (1), the noninverted output signal V+ on the noninverting output terminal 206 of the differential amplifier 200 comprises the DC component $V_{DC+}$ and the AC component $V_{AC+}$. Similarly, the inverted output signal V- on the inverting output terminal 208 comprises the DC component $V_{DC-}$ and the AC component $V_{AC-}$. Since the first operational amplifier 440 and its associated components have caused the DC components of both signals to be equal to $V_{DC\pm}$, the Equations (1) and (2) become:

$$V+ = V_{DC\pm} + V_{AC+} \quad (1')$$

$$V- = V_{DC\pm} + V_{AC-} \quad (2')$$

Substituting the Equations (1') and (2') into the Equations (16) and (17), the two output signals become:

$$V_{OUT+} = (1/19)[6V_{DC\pm} + 6V_{AC+} + 18V_{REF} - 6V_{DC\pm} +] \quad (18)$$

$$V_{OUT-} = (1/3)(3V_{REF}/2 - V_{DC\pm}) + (1/3)(V_{DC\pm} + V_{AC-}) \quad (19)$$

The Equations (18) and (19) can be further simplified to show that the two output signals are a function only of the AC components and the reference voltage as follows:

$$V_{OUT+} = (1/19)[6V_{AC+} 30\ 18V_{REF} + V_{276}] \quad (20)$$

$$V_{OUT-} = V_{REF} + (V_{AC-})/3 \quad (21)$$

The Equation (20) shows that the noninverted output signal $V_{OUT+}$ on the noninverting input terminal 272 of the comparator 270 has a DC component that is a function only of the predetermined reference voltage $V_{REF}$ supplied by the reference voltage source 500 and of the output voltage of the comparator 270, which can have only one of two magnitudes (i.e., zero volts or +5 volts in the preferred embodiment), and an AC component that is equal to 6/19 times the AC+ component of the noninverted output signal V+ on the noninverting output terminal 206 of the differential amplifier 200. The Equation (21) shows that the inverted output signal $V_{OUT-}$ on the inverting input terminal 274 of the comparator 270 has a DC component that is also equal to the predetermined reference voltage $V_{REF}$ supplied by the reference voltage source 500 and an AC component that is equal to one-third the AC− component of the inverted output signal V− on the noninverting output terminal 208 of the differential amplifier 200. Thus, it can be seen that the second operational amplifier 450 and its associated circuitry operate to cause the noninverted and inverted output signals $V_{OUT+}$ and $V_{OUT-}$ from the compensation circuit 410 to have a known predetermined DC component that is equal to the reference voltage $V_{REF}$. With these compensated signals provided as inputs to the comparator 270 of the second threshold detector circuit 230, as discussed above, the second threshold detector circuit 230 operates properly in accordance with the idealized second threshold detector circuit 230 as illustrated by the waveforms of FIGS. 10-12 rather than improperly in accordance with the waveforms of FIGS. 13-18.

It can be seen from the foregoing that the compensation circuit 410 of the present invention solves both problems associated with the previously known read circuits. Namely, the differential amplifier 200 is automatically controlled to provide a differential output voltage that has an offset voltage that is substantially equal to zero when the differential voltage applied to the input of the differential amplifier 200 is equal to zero irrespective of changes caused by temperature and aging. The compensation circuit 410 further assures that the input signals applied to the comparator 270 in the second threshold detector circuit 230 have a known, predetermined common mode voltage so that the output signal provided by the second threshold detector circuit 230 operates properly and provides symmetrical voltage margins for performing the read after write operation described above.

While this invention has been described for use in tape drives, the compensation circuit of the invention can be used in combination with other circuits relating to disk drives and other magnetic media data storage devices. Furthermore, the compensation circuit can be used in conjunction with other electronic circuits where it is desireable to compensate for non-zero differential offset voltages and unknown common mode voltages. Other uses for the compensation circuit of the present invention will be apparent to those skilled in the art

What is claimed is:

1. A compensation circuit that produces a compensation signal to reduce the magnitude of the differential offset voltage between DC components of noninverted and inverted output signals generated by a differential amplifier having an offset control input terminal to control the DC differential offset of the noninverted and inverted output signals of said differential amplifier, said compensation circuit, comprising:

an isolation circuit that isolates the DC components from AC components of each of the noninverted and inverted output signals from said differential amplifier to provide a differential signal proportional to said differential offset voltage; and an amplifying circuit that amplifies said differential signal and generates said compensation signal proportional to said differential offset voltage, said compensation signal being fed back to said offset control input terminal to control the DC differential offset of said differential amplifier to reduce said differential offset voltage.

2. The compensation circuit, as defined in claim 1, wherein said amplifier circuit comprises an operational amplifier having first and second input terminals, and wherein said isolation circuit comprises a first resistor to couple said noninverted output signal to said first input terminal, a second resistor to couple said inverted output signal to second input terminal, a series combination of a third resistor and a first capacitor to couple the AC component of said inverted output signal to said first input terminal, and a fourth resistor and a second capacitor to couple the AC component of said noninverted output signal to said second input terminal, said AC components substantially cancelling each other at said first and second inputs of said amplifier so that said amplifier amplifies the difference between the DC components of said noninverted and inverted output signals of said differential amplifier.

3. The compensation circuit, as defined in claim 1, wherein the amplifying circuit comprises an operational amplifier.

4. The compensation circuit, as defined in claim 1, wherein the amplifying circuit comprises an operational amplifier with a capacitor, such that the combination is an active low-pass filter.

5. A method of controlling DC differential offset of a differential amplifier that provides first and second differential output signals having a differential offset voltage therebetween, said method comprising the steps of:

isolating DC components from AC components of each of the first and second differential signals;

summing the AC component of the first differential signal with the DC component from the second differential signal to provide a first sum signal;

summing the AC component of the second differential signal with the DC component of the first differential signal to provide a second sum signal;

providing the first and second sum signals to an operational amplifier to provide an output signal responsive to the voltage difference between said first and second sum signals; and providing the output signal from the operational amplifier as an input signal to a DC differential offset control input of the differential amplifier to control the DC differential offset of the differential amplifier to reduce the difference between the first and second sum signals, thereby reducing the difference between the DC components of the first and second differential output signals from said differential amplifier.

6. A compensation circuit that receives first and second differential input signals from a differential amplifier and that provides two differential output signals having a substantially constant common mode voltage of a predetermined magnitude responsive to a predetermined reference voltage, comprising:

a first circuit that is responsive to a differential offset voltage between said first and second differential input signals from said differential amplifier and that provides a feedback signal to said differential amplifier to adjust DC differential offset of said differential amplifier so that said differential offset voltage is substantially equal to zero;

a second circuit that receives a first input signal responsive to the common mode voltage of said first and second differential input signals from said differential amplifier and a second input signal that is responsive to said predetermined reference voltage, said second circuit providing an output signal responsive to the difference between said first input signal and said second input signal; and a voltage divider network that receives said output signal from said second circuit and that receives said differential input signals from said differential amplifier, said voltage divider network providing first and second differential output signals that have said substantially constant common mode voltage of said predetermined magnitude.

7. The compensation circuit, as defined in claim 6, wherein said second circuit comprises:

an operational amplifier that receives said signal responsive to said common mode voltage on its noninverting input and that receives said signal responsive to said predetermined reference voltage on its second input.

8. A method of generating a pair of differential output signals having a known common mode voltage substantially equal to a predetermined reference voltage, comprising the steps of:

receiving a pair of differential input voltages having an unknown common mode voltage;

isolating a DC voltage level responsive to said unknown common mode voltage;

providing said isolated DC voltage level as one input to an operational amplifier;

providing a second signal responsive to said predetermined reference voltage as a second input to said operational amplifier;

generating an restoration voltage output signal responsive to the difference between said isolated DC voltage level and said second signal;

providing said restoration voltage output signal as an input to a voltage divider circuit;

providing said pair of differential input signals as inputs to said voltage divider circuit; and providing a pair of differential output signals from said voltage divider circuit having a common mode voltage substantially equal to said reference voltage.

9. A signal processing apparatus, comprising:

a differential amplifier having first and second inputs and first and second outputs, said first output producing a first output signal and said second output producing a second output signal, each of said first and second output signals having a DC component and an AC component, said DC components having unknown magnitudes;

a compensation circuit, connected to receive said first and second output signals, that generates a feedback signal that is provided to said differential amplifier to adjust relative magnitudes of said DC components of said first and second output signals to be substantially equal;

a control circuit, connected to receive said first and second output signals, said control circuit comparing a signal responsive to the DC component of at least one of said first and second output signals with a reference signal and adjusting the magnitudes of said DC components to provide first and second compensated output signals, each having a DC component with a known fixed magnitude; and a zero-crossing detector that compares said first and second compensated output signals and provides a detector output signal responsive to the relative magnitudes of said first and second compensated output signals.

10. The apparatus as defined in claim 9, wherein said compensation circuit comprises an operational amplifier having first and second inputs, said first operational amplifier input connected to receive the AC component of said first differential amplifier output signal and said second differential amplifier output signal, said second operational amplifier input connected to receive the AC component of said second differential amplifier output signal and said first differential amplifier output signal, said operational amplifier providing an output signal responsive to a difference in magnitude in said DC components of said first and second differential amplifier output signals.

11. The apparatus as defined in claim 9, wherein said control circuit comprises:

an operational amplifier having a first input that receives said signal responsive to said DC component and a second input that receives said reference signal, said operational amplifier providing a restoration signal having a magnitude responsive to the difference between said signal responsive to said DC component and said reference signal; and a network that receives said first and second differential amplifier output signals and said restoration signal, said network providing said first and second compensated output signals.

12. The apparatus as defined in claim 11, wherein said network comprises first and second voltage dividers each having first and second inputs and an output, said first input of said first voltage divider connected to receive said first differential amplifier output and said second input of said first voltage divider connected to receive said second differential amplifier output, said second inputs of said first and second voltage dividers connected to receive said restoration signal, said outputs of said first and second voltage dividers providing said first and second compensated output signals, respectively.

13. The apparatus as defined in claim 12, wherein said restoration signal increases when said signal responsive to said DC component decreases and decrease when said signal responsive to said DC component increases thereby maintaining the DC components of said first and second compensated output signals at a substantially constant magnitude.

* * * * *

UNITED STATES PATENT AND TRADEMARK OFFICE
CERTIFICATE OF CORRECTION

PATENT NO. : 4,833,418

DATED : May 23, 1989

INVENTOR(S) : John J. Quintus, et al.

It is certified that error appears in the above-identified patent and that said Letters Patent is hereby corrected as shown below:

```
In the Abstract, at line 19, change "amplifier each" to
     --amplifier are each--.
In Column 2, at line 31, change "such a magnetic" to --such
     as magnetic--.
In Column 5, at line 35, change "terminal 1156" to
     --terminal 156--.
In Column 7, at line 10, change "In FIG. the" to --In FIG.
     1, the--.
In Column 7, at line 25, change "resistor 22 to" to
     --resistor 252 to--.
In Column 7, at line 52, change "resistors 222 and 254" to
     --resistors 252 and 254--.
In Column 8, at line 32, change "in tee art related" to --in
     the art related--.
In Column 8, at line 33, change "that there a number" to
     --that there are a number--.
In Column 8, at line 51, change "signals." to --signals
     occurred.--.
In Column 9, at line 23, change "282 and 244" to --282 and
     284--.
In Column 12, at line 16, change "FIG. 44" to --FIG. 14--.
In Column 12, at line 36, change "circuit 330" to --circuit
     230--.
In Column 14, at line 67, change "+VAC-" to --+$V_{AC}$- --.
In Column 16, at line 11, change "47" to --472--.
```

UNITED STATES PATENT AND TRADEMARK OFFICE
CERTIFICATE OF CORRECTION

PATENT NO. : 4,833,418

DATED : May 23, 1989

INVENTOR(S) : John J. Quintus, et al.

It is certified that error appears in the above-identified patent and that said Letters Patent is hereby corrected as shown below:

In Column 17, at line 33, change "gain add" to --gain and--.

In Column 20, at line 24, change "45" to --450--.

In Column 21, at line 27, change Equation (14)
from "$V_{OUT+}=(1/19)[(6V+) \cdot 12V_{OUT2}+V_{276}]$"
to --$V_{OUT+}=(1/19)[(6V+)+12V_{OUT2}+V_{276}]$--.

In Column 21, at line 35, change Equation (16)
from "$V_{OUT+}=(1/19)[(6V+)+12(3V_{REF}-V_{DC\pm})/2+V-_{276}]$
$=(1/19)[(6V+)+18V_{REF}-6V_{DC\pm}+V_{276}]$"
to --$V_{OUT+}=(1/19)[(6V+)+12(3V_{REF}-V_{DC\pm})/2+V_{276}]$
$=(1/19)[(6V+)+18V_{REF}-6V_{DC\pm}+V_{276}]$--.

In Column 21, at line 59, change Equation (18)
from "$V_{OUT+}=(1/19)[6V_{DC\pm}+6V_{AC+}+18-V_{REF}-6V_{DC\pm}+$"
to --$V_{OUT+}=(1/19)[6V_{DC\pm}+6V_{AC+}+18V_{REF}-6V_{DC\pm}+V_{276}]$--.

In Column 21, at line 68, change Equation (20)
from "$V_{OUT+}=(1/19)[6V_{AC+}30\ 18V_{REF}+V_{276}]$"
to --$V_{OUT+}=(1/19)[6V_{AC+}+18V_{REF}+V_{276}]$--.

In Column 23, at line 5 (Claim 1, line 10), change "from AC components" to --from the AC components--.

In Column 23, at line 17 (Claim 2, line 2), change "amplifier" to --amplifying--.

In Column 23, at line 22 (Claim 2, line 7), change "to second input" to --to said second input--.

UNITED STATES PATENT AND TRADEMARK OFFICE
CERTIFICATE OF CORRECTION

PATENT NO.  : 4,833,418

DATED       : May 23, 1989

INVENTOR(S) : John J. Quintus, et al.

It is certified that error appears in the above-identified patent and that said Letters Patent is hereby corrected as shown below:

In Column 24, at line 7 (Claim 6, line 11), change "adjust DC" to --adjust the DC--.

In Column 24, at line 68 (Claim 9, line 12), change "adjust relative" to --adjust the relative--.

In Column 25, at line 27 (Claim 10, line 11), change "to a difference" to --to the difference--.

In Column 26, at line 17 (Claim 12, line 6), change "second input of said first" to --first input of said second--.

In Column 26, at line 26 (Claim 13, line 3), change "decreases and decrease" to --decreases and decreases--.

Signed and Sealed this

Thirty-first Day of March, 1992

*Attest:*

HARRY F. MANBECK, JR.

*Attesting Officer*  *Commissioner of Patents and Trademarks*